(12) United States Patent
Son et al.

(10) Patent No.: US 10,999,045 B2
(45) Date of Patent: May 4, 2021

(54) NONVOLATILE SEMICONDUCTOR DEVICES INCLUDING NON-CIRCULAR SHAPED CHANNEL PATTERNS AND METHODS OF MANUFACTURING THE SAME

(71) Applicant: Samsung Electronics Co., Ltd., Suwon-si, Gyeonggi-do (KR)

(72) Inventors: Yong-Hoon Son, Yongin-si (KR); Hanmei Choi, Seoul (KR); Kihyun Hwang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 171 days.

(21) Appl. No.: 15/901,093

(22) Filed: Feb. 21, 2018

(65) Prior Publication Data

US 2018/0191481 A1    Jul. 5, 2018

Related U.S. Application Data

(63) Continuation of application No. 15/467,377, filed on Mar. 23, 2017, now Pat. No. 10,164,754.

(30) Foreign Application Priority Data

Apr. 11, 2016 (KR) .......................... 10-2016-0044395

(51) Int. Cl.
| | |
|---|---|
| *H04L 5/00* | (2006.01) |
| *H01L 29/78* | (2006.01) |
| *H01L 27/11565* | (2017.01) |
| *H01L 27/1157* | (2017.01) |
| *H01L 27/11575* | (2017.01) |

(Continued)

(52) U.S. Cl.
CPC ........ *H04L 5/0091* (2013.01); *H01L 27/1157* (2013.01); *H01L 27/11565* (2013.01); *H01L 27/11575* (2013.01); *H01L 27/11582* (2013.01); *H01L 29/66666* (2013.01); *H01L 29/66833* (2013.01); *H01L 29/7827* (2013.01); *H01L 29/7926* (2013.01); *H04L 1/1812* (2013.01)

(58) Field of Classification Search
CPC ................ H04L 5/0091; H04L 1/1812; H01L 27/11565; H01L 27/1157; H01L 27/11575; H01L 27/11582; H01L 29/66666; H01L 29/66833; H01L 29/7827; H01L 29/7926
USPC ....................................................... 257/314
See application file for complete search history.

(56) References Cited

U.S. PATENT DOCUMENTS 7,005,700 B2   2/2006  Lee
7,952,932 B2   5/2011  Van Duuren et al.
(Continued)

FOREIGN PATENT DOCUMENTS

KR       20140020139         2/2014

*Primary Examiner* — Dzung Tran
(74) *Attorney, Agent, or Firm* — Sughrue Mion, PLLC

(57) ABSTRACT

A non-volatile memory structure can include a substrate extending horizontally and a filling insulating pattern extending vertically from the substrate. A plurality of active channel patterns can extend vertically from the substrate in a zig-zag pattern around a perimeter of the filling insulating pattern, where each of the active channel patterns having a respective non-circular shaped horizontal cross-section. A vertical stack of a plurality of gate lines can each extend horizontally around the filling insulating pattern and the plurality of active channel patterns.

18 Claims, 54 Drawing Sheets

(51) Int. Cl.
    *H01L 27/11582*  (2017.01)
    *H01L 29/66*     (2006.01)
    *H01L 29/792*    (2006.01)
    *H04L 1/18*      (2006.01)

(56) References Cited

U.S. PATENT DOCUMENTS

| | | | |
|---|---|---|---|
| 8,809,943 B2 | 8/2014 | Lim et al. | |
| 8,829,589 B2 | 9/2014 | Lee et al. | |
| 9,076,820 B2 | 7/2015 | Kitazaki et al. | |
| 9,111,963 B2 | 8/2015 | Murakami | |
| 9,184,178 B2 | 11/2015 | Jang et al. | |
| 9,219,070 B2 | 12/2015 | Thimmegowda et al. | |
| 9,754,964 B2 | 9/2017 | Yune | H01L 27/11582 |
| 2005/0051806 A1* | 3/2005 | Masuoka | H01L 27/115 257/222 |
| 2010/0078701 A1* | 4/2010 | Shim | H01L 27/11521 257/314 |
| 2012/0217467 A1* | 8/2012 | Tan | H01L 27/11568 257/9 |
| 2013/0193395 A1* | 8/2013 | Lee | H01L 27/2436 257/4 |
| 2014/0097484 A1* | 4/2014 | Seol | H01L 23/528 257/324 |
| 2015/0001460 A1* | 1/2015 | Kim | H01L 27/11578 257/5 |
| 2015/0054058 A1* | 2/2015 | Seol | H01L 29/42332 257/324 |
| 2015/0194435 A1 | 7/2015 | Lee | |
| 2017/0200733 A1 | 7/2017 | Lee | H01L 21/76816 |

\* cited by examiner

NONVOLATILE SEMICONDUCTOR DEVICES INCLUDING NON-CIRCULAR SHAPED CHANNEL PATTERNS AND METHODS OF MANUFACTURING THE SAME

CROSS-REFERENCE TO RELATED APPLICATION

This U.S. non-provisional patent application is a continuation of U.S. patent application Ser. No. 15/467,311; filed Mar. 23, 2017 and claims priority under 35 U.S.C. § 119 to Korean Patent Application No. 10-2016-0044395, filed on Apr. 11, 2016, in the Korean Intellectual Property Office, the disclosures of which are hereby incorporated by reference in their entireties.

BACKGROUND

Embodiments of the inventive concepts relate to a semiconductor device and, more particularly, to a vertical memory device and a method of manufacturing the same.

Semiconductor devices have been highly integrated to provide excellent performance and low manufacturing costs. In particular, an integration density of memory devices may be an important factor determining costs thereof. The integration density of conventional two-dimensional (2D) semiconductor memory devices may be mainly determined by an area that a unit memory cell occupies. Therefore, the integration density of the conventional 2D semiconductor memory devices may be affected by techniques of forming fine patterns. However, since extremely high-priced apparatuses may be called for to form fine patterns, the integration density of 2D semiconductor memory devices may be limited.

SUMMARY

Embodiments according to the inventive concept can provide non-volatile semiconductor devices including non-circular shaped channel patterns and methods of forming the same. Pursuant to these embodiments, a non-volatile memory structure can include a substrate extending horizontally and a filling insulating pattern extending vertically from the substrate. A plurality of active channel patterns can extend vertically from the substrate in a zig-zag pattern around a perimeter of the filling insulating pattern, where each of the active channel patterns having a respective non-circular shaped horizontal cross-section. A vertical stack of a plurality of gate lines can each extend horizontally around the filling insulating pattern and the plurality of active channel patterns.

In some embodiments, a non-volatile memory structure can include a substrate extending horizontally and an insulating pattern extending vertically from the substrate, where the insulating pattern defines a perimeter side wall that includes a plurality of outwardly curved portions and linear portions between the outwardly curved portions. A plurality of active channel patterns can extend vertically from the substrate inside the perimeter side wall, where each active channel pattern can be recessed into a respective outwardly curved portion of the perimeter side wall.

In some embodiments, a non-volatile memory structure can include a substrate extending horizontally and an insulating pattern extending vertically from the substrate, where the insulating pattern can define a perimeter side wall that includes outwardly curved portions and linear portions between the outwardly curved portions. A gate electrode can conform to the outside of the perimeter side wall and can be absent from inside the perimeter side wall.

In some embodiments, a vertical NAND non-volatile memory structure can include a substrate extending horizontally and a channel pattern configured to store data, extending vertically from the substrate, where the channel pattern can have a non-circular shape in a plan view of the channel pattern.

In some embodiments, a method of forming a non-volatile memory structure can include forming an opening in a vertical stack of layers to expose a substrate, the opening defined by a perimeter sidewall that includes outwardly curved portions and linear portions between the outwardly curved portions. A semiconductor material can be formed in the opening to fill the outwardly curved portions and leave a void in the opening. The semiconductor material can be removed from the opening so that separated portions of the semiconductor material remain in the outwardly curved portions to provide a plurality of channel patterns.

BRIEF DESCRIPTION OF THE DRAWINGS

FIGS. 8A to 13A are plan views illustrating a method of manufacturing a semiconductor device according to some embodiments of the inventive concepts.

FIGS. 8B to 13B are cross-sectional views taken along the lines A-A' of FIGS. 8A to 13A, respectively.

FIGS. 8C to 13C are cross-sectional views taken along the lines B-B' of FIGS. 8A to 13A, respectively.

FIGS. 15A to 19A are plan views illustrating a method of manufacturing a semiconductor device according to some embodiments of the inventive concepts.

FIGS. 15B to 19B are cross-sectional views taken along the lines A-A' of FIGS. 15A to 19A, respectively.

FIGS. 15C to 19C are cross-sectional views taken along the lines B-B' of FIGS. 15A to 19A, respectively.

DETAILED DESCRIPTION OF EMBODIMENTS

Figure 1:
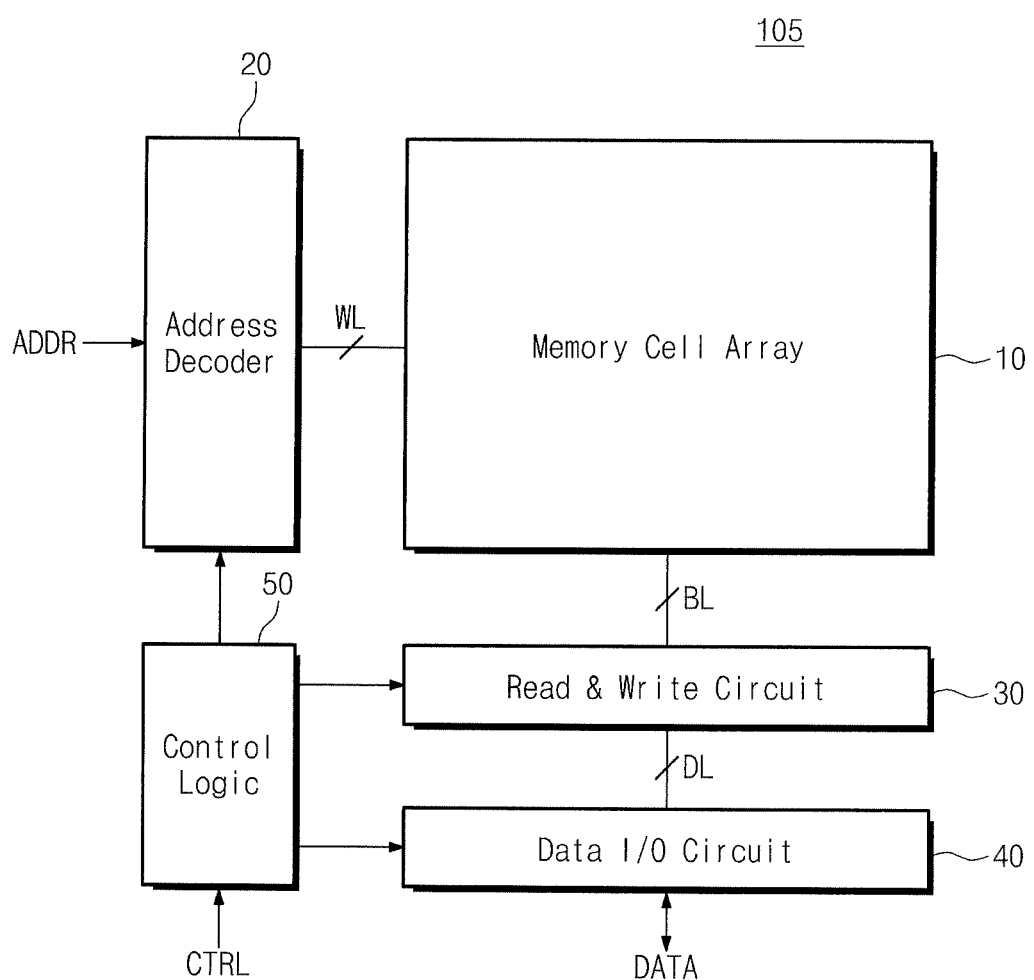
FIG. 1 is a schematic block diagram illustrating a semiconductor device according to some embodiments of the inventive concepts.

FIG. 1 is a schematic block diagram illustrating a semiconductor device according to some embodiments of the inventive concepts. Referring to FIG. 1, a semiconductor device 105 according to some embodiments of the inventive concepts may include a memory cell array 10, an address decoder 20, a read/write circuit 30, a data input/output (I/O) circuit 40, and a control logic 50. The semiconductor device 105 may be a semiconductor memory device.

The memory cell array 10 may be connected to the address decoder 20 through a plurality of word lines WL and may be connected to the read/write circuit 30 through a plurality of bit lines BL. The memory cell array 10 may include a plurality of memory cells. For example, the memory cell array 10 may be configured to store one or more bits in each memory cell.

The address decoder 20 may be connected to the memory cell array 10 through the word lines WL. The address decoder 20 may be operated in response to a control signal of the control logic 50. The address decoder 20 may receive address signals ADDR from an external system. The address decoder 20 may decode a row address signal of the received address signals ADDR to select a corresponding one of the word lines WL. In addition, the address decoder 20 may decode a column address signal of the received address signals ADDR and may provide the decoded column address signal to the read/write circuit 30. For example, the address decoder 20 may include a row decoder, a column decoder, and an address buffer.

The read/write circuit 30 may be connected to the memory cell array 10 through the bit lines BL and may be connected to the data I/O circuit 40 through data lines DL. The read/write circuit 30 may be operated in response to a control signal of the control logic 50. The read/write circuit 30 may be configured to receive the decoded column address signal from the address decoder 20. The read/write circuit 30 may select one of the bit lines BL using the decoded column address signal. For example, the read/write circuit 30 may receive data from the data I/O circuit 40 and may write the received data into the memory cell array 10. The read/write circuit 30 may read data from the memory cell array 10 and may provide the read data to the data I/O circuit 40. The read/write circuit 30 may read data from a first storage region of the memory cell array 10 and may write the read data into a second storage region of the memory cell array 10. For example, the read/write circuit 30 may be configured to perform a copy-back operation.

The read/write circuit 30 may include components including a page buffer (or a page register) and a column selection circuit. Alternatively, the read/write circuit 30 may include components including a sense amplifier, a write driver, and a column selection circuit.

The data I/O circuit 40 may be connected to the read/write circuit 30 through the data lines DL. The data I/O circuit 40 may be operated in response to a control signal of the control logic 50. The data I/O circuit 40 may exchange data DATA with an external system. The data I/O circuit 40 may transmit the data DATA received from the external system to the read/write circuit 30 through the data lines DL. The data I/O circuit 40 may provide the data DATA, received from the read/write circuit 30 through the data lines DL, to the external system. For example, the data I/O circuit 40 may include a component such as a data buffer.

The control logic 50 may be connected to the address decoder 20, the read/write circuit 30, and the data I/O circuit 40. The control logic 50 may control operations of the semiconductor device 105. The control logic 50 may be operated in response to control signal CTRL transmitted from an external system.

Figure 2:
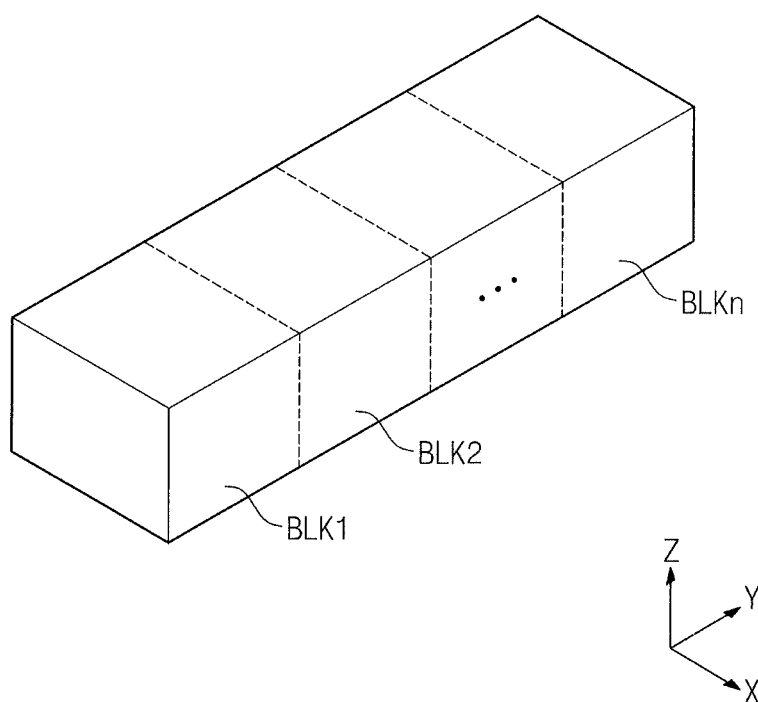
FIG. 2 is a schematic block diagram illustrating a memory cell array of FIG. 1.

FIG. 2 is a schematic block diagram illustrating an embodiment of the memory cell array 10 of FIG. 1. Referring to FIG. 2, the memory cell array 10 may include a plurality of memory blocks BLK1 to BLKn. Each of the memory blocks BLK1 to BLKn may have a three-dimensional (3D) structure (or a vertical structure). For example, each of the memory blocks BLK1 to BLKn may include structures that extend in first, second, and third directions X, Y, and Z intersecting each other. For example, each of the memory blocks BLK1 to BLKn may include a plurality of cell strings extending in the third direction Z e.g., a vertical direction.

Figure 3:
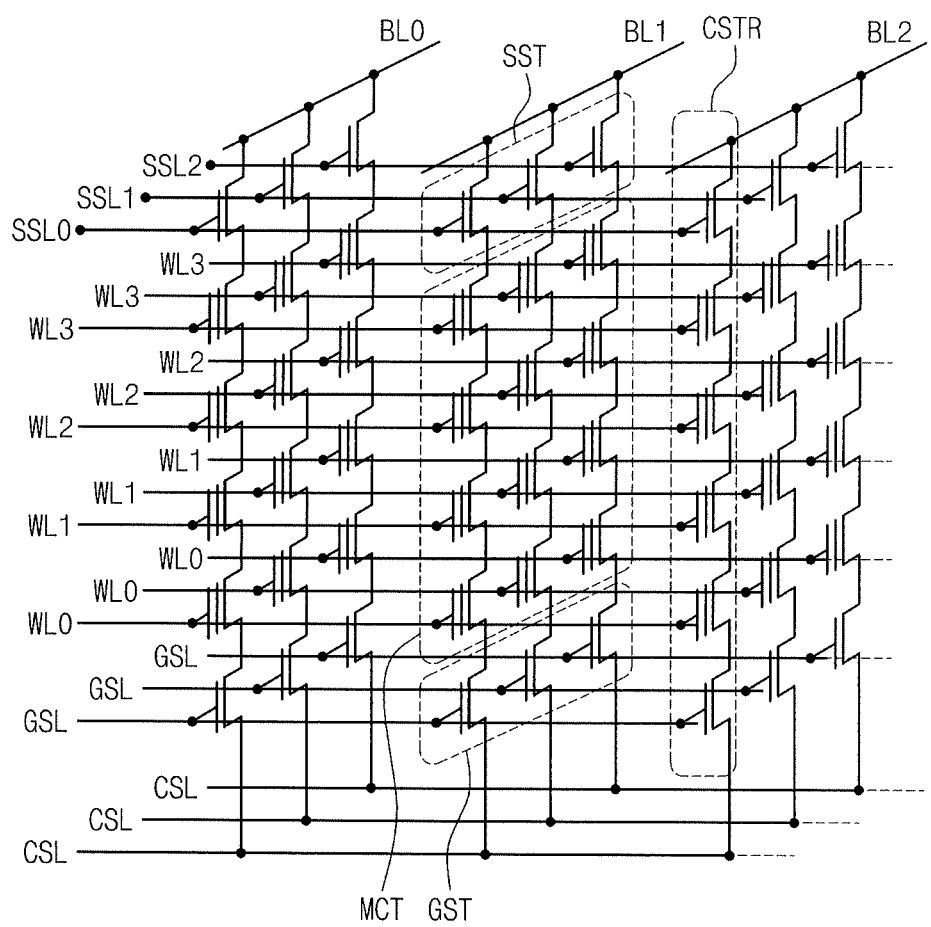
FIG. 3 is a schematic circuit diagram illustrating a cell array of a semiconductor device according to some embodiments of the inventive concepts.

FIG. 3 is a schematic circuit diagram illustrating a cell array of a semiconductor device according to some embodiments of the inventive concepts.

A semiconductor device according to some embodiments of the inventive concepts may include a common source line CSL, a plurality of bit lines BL0 to BL2, and a plurality of cell strings CSTR connected between the common source line CSL and the bit lines BL0 to BL2. The bit lines BL0 to BL2 may be two-dimensionally arranged and a plurality of the cell strings CSTR may be connected in parallel to each of the bit lines BL0 to BL2. Thus, the cell strings CSTR may be two-dimensionally arranged on the common source line CSL or a substrate.

Each of the cell strings CSTR may include a ground selection transistor GST connected to the common source line CSL, a string selection transistor SST connected to one of the bit lines BL0 to BL2, and a plurality of memory cell transistors MCT disposed between the ground and string selection transistors GST and SST. The ground selection transistor GST, the memory cell transistors MCT, and the string selection transistor SST may be connected in series to each other in the order named. Ground selection lines GSL, a plurality of word lines WL0 to WL3, and string selection lines SSL0 to SSL2, which are disposed between the common source lines CSL and the bit lines BL0 to BL2, may be used as gate electrodes of the ground selection transistors GST, gate electrodes of the memory cell transistors MCT, and gate electrodes of the string selection transistors SST, respectively.

The gate electrodes of some ground selection transistors GST may be connected in common to one of the ground selection line GSL so as to be in an equipotential state. Similarly, the gate electrodes of the memory cell transistors MCT disposed at the same level from the ground selection line GSL may be connected in common to one of the word lines WL0 to WL3 so as to be in an equipotential state. Since one cell string CSTR includes the plurality of memory cell transistors MCT respectively located at different levels from the ground selection line GSL, the word lines WL0 to WL3 respectively located at different levels from each other may be disposed between the ground selection line GSL and the bit lines BL0 to BL2.

The ground and string selection transistors GST and SST and the memory cell transistors MCT may be metal-oxide-semiconductor (MOS) field effect transistors using a channel structure as channel regions. In certain embodiments, MOS capacitors may be formed by a channel structure, the ground selection line GSL, the word lines WL0 to WL3, and the string selection lines SSL0 to SSL2. In this case, the ground selection transistor GST, the memory cell transistors MCT, and the string selection transistor SST may share inversion layers generated by fringe fields generated from the lines GSL, WL0 to WL3, and SSL0 to SSL2, and thus the transistors GST, MCT, and SST included in one cell string CSTR may be electrically connected to each other.

Figure 4:
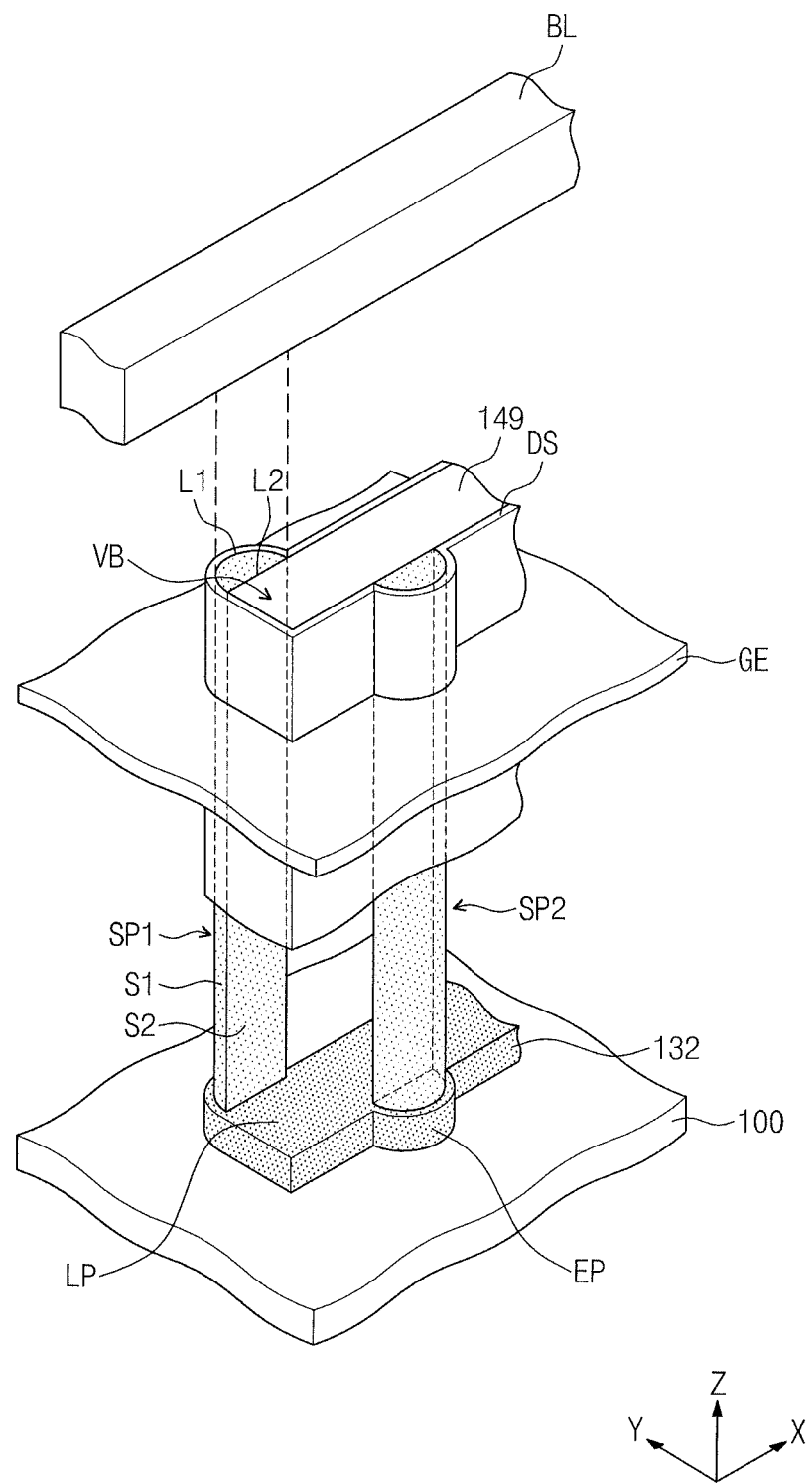
FIG. 4 is a perspective view illustrating a semiconductor device according to some embodiments of the inventive concepts.

FIG. 4 is a perspective view illustrating a semiconductor device according to some embodiments of the inventive concepts. A vertical block VB may be provided on a substrate 100. The vertical block VB may vertically penetrate gate electrodes GE disposed on the substrate 100. A plurality of the gate electrodes GE may be provided on the substrate 100. However, one gate electrode GE is illustrated in FIG. 4 for the purpose of ease and convenience in explanation. The vertical block VB may extend from a top surface of the substrate 100 in a third direction Z perpendicular to the top surface of the substrate 100. In addition, the vertical block VB may extend in a first direction X parallel to the top surface of the substrate 100. In other words, the vertical block VB may be a plate-type structure disposed in a plane defined by the first direction X and the third direction Z. In other words, the vertical block VB may be the plate-type structure substantially perpendicular to the top surface of the substrate 100.

The vertical block VB may include a filling insulation pattern 149 extending in the first direction X and channel patterns SP1 and SP2 spaced apart from each other with the filling insulation pattern 149 interposed therebetween. The filling insulation pattern 149 may have a line or bar shape extending longitudinally in the first direction X when viewed from a plan view.

A data storage layer DS may be disposed between the gate electrodes GE and the channel patterns SP1 and SP2. The data storage layer DS may extend along a sidewall of the filling insulation pattern 149 in the third direction Z as illustrated in FIG. 4. In some embodiments, the filling insulation pattern 149 can include the data storage layer DS. As further shown in FIG. 4, in some embodiments, the gate electrode GE can surround the perimeter of the filling insulation pattern 149 and be absent from inside of the filling insultion pattern 149. However, embodiments of the inventive concepts are not limited thereto.

Each of the channel patterns SP1 and SP2 may form a portion of the cell string CSTR described with reference to FIG. 3. In other words, each of the channel patterns SP1 and SP2 may form an individual cell string CSTR and may be electrically connected to a bit line BL.

The channel patterns SP1 and SP2 may include a first channel pattern SP1 laterally protruding from one sidewall of the filling insulation pattern 149 and a second channel pattern SP2 laterally protruding from another sidewall, opposite the one sidewall, of the filling insulation pattern 149. The second channel pattern SP2 may be shifted in the first direction X from an imaginary line that passes through a center of the first channel pattern SP1 and is parallel to a second direction Y intersecting the first and third directions X and Z. When each of the first and second channel patterns SP1 and SP2 is provided in plurality, the first channel patterns SP1 and the second channel patterns SP2 may be alternately arranged in a zigzag form along the first direction X. Alternatively, the first channel pattern SP1 and the second channel pattern SP2 may be mirror-symmetric with respect to the filling insulation pattern 149 interposed therebetween. In some embodiments, the channel patterns SP1 and SP2 have a non-circular shaped horizontal cross-section and are located inside the perimeter of the filling insulation pattern 149.

Each of the first and second channel patterns SP1 and SP2 may have a first surface S1 facing the data storage layer DS and a second surface S2 facing the filling insulation pattern 149. The first surface S1 may be in contact with the data storage layer DS, and the second surface S2 may be in contact with the filling insulation pattern 149.

A radius of curvature of the second surface S2 may be greater than a radius of curvature of the first surface S1 when viewed from a plan view. In other words, each of the first and second channel patterns SP1 and SP2 may include a first line L1 corresponding to the first surface S1 and a second line L2 corresponding to the second surface S2 in a plan view, and a radius of curvature of the second line L2 may be greater than a radius of curvature of the first line L1. In some embodiments, the second surface S2 may be a substantially flat surface, and the second line L2 may be a substantially straight line. However, embodiments of the inventive concepts are not limited thereto. When the semiconductor device according to some embodiments of the inventive concepts is operated, channels of transistors may be formed at a region adjacent to the first surface S1 but may not be formed at a region adjacent to the second surface S2.

Each of the first and second channel patterns SP1 and SP2 may have a substantially semi-cylindrical shape. In the present specification, the semi-cylindrical shape is not limited to half of a cylinder cut longitudinally but is defined to include a shape more or less than half of a cylinder cut longitudinally (i.e., more or less than a semi-circular shape).

The vertical block VB may further include a lower semiconductor pattern 132 disposed between the substrate 100 and the channel patterns SP1 and SP2. The lower semiconductor pattern 132 may include an epitaxial layer grown using the substrate 100 as a seed. The first channel pattern SP1 and the second channel pattern SP2 may be connected in common to the lower semiconductor pattern 132. When each of the first and second channel patterns SP1 and SP2 is provided in plurality, the first channel patterns SP1 and the second channel patterns SP2 of one vertical block VB may be connected in common to one lower semiconductor pattern 132.

The lower semiconductor pattern 132 may extend in the first direction X corresponding to the extending direction of the filling insulation pattern 149. The lower semiconductor pattern 132 may include a linear portion LP extending in the first direction X and extending portions EP extending from the linear portion LP under the first and second channel patterns SP1 and SP2. The extending portions EP may have shapes corresponding to the shapes of the first and second channel patterns SP1 and SP2 in a plan view. For example, the shapes of the extending portions EP may be similar to semicircular shapes in a plan view. In some embodiments, the linear portion LP can be formed self-aligned to the perimeter of the filling insulating pattern 149. A bottom surface of the first channel pattern SP1 and a bottom surface of the second channel pattern SP2 may be in contact with a top surface of the lower semiconductor pattern 132. In certain embodiments, the lower semiconductor pattern 132 may not be provided.

Figure 5A:
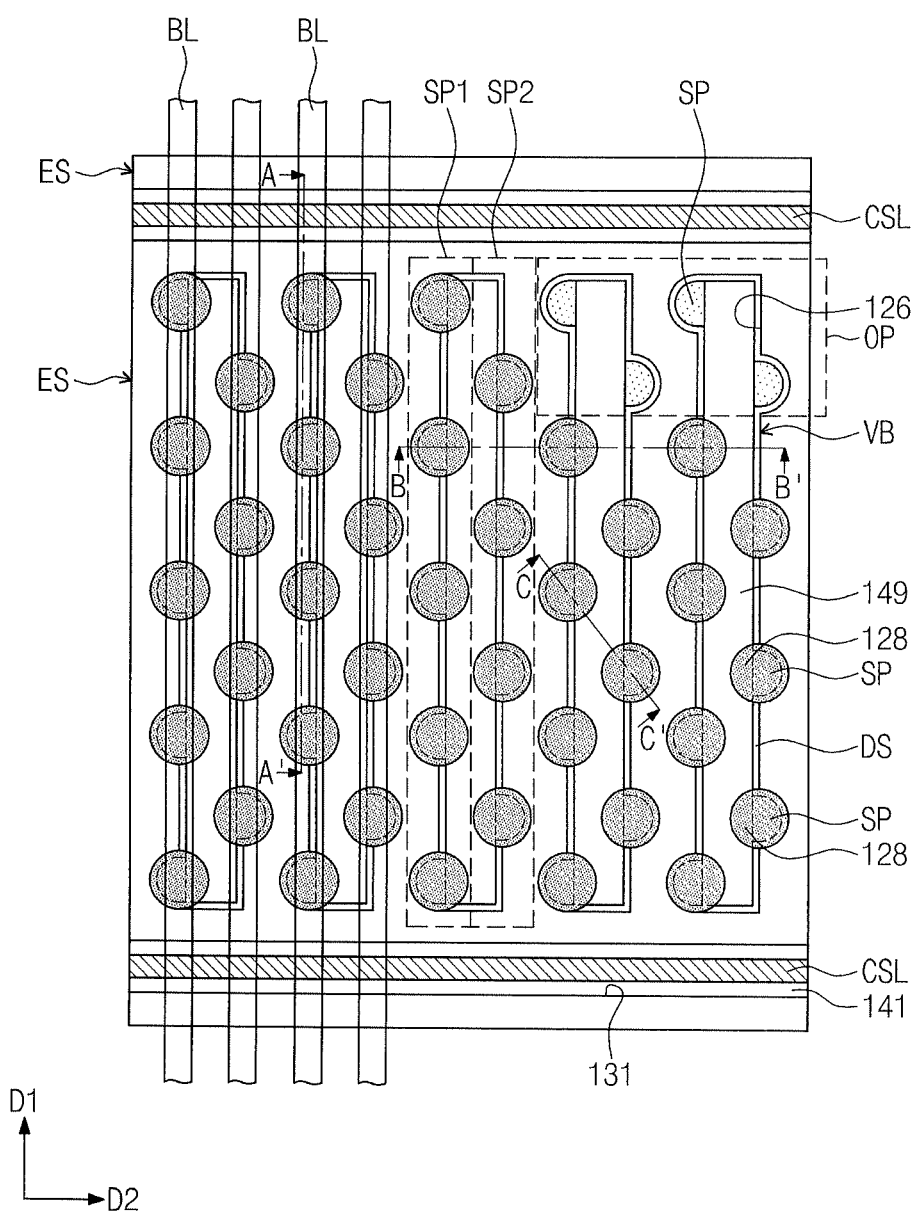
FIG. 5A is a plan view illustrating a semiconductor device according to some embodiments of the inventive concepts.
Figure 5B:
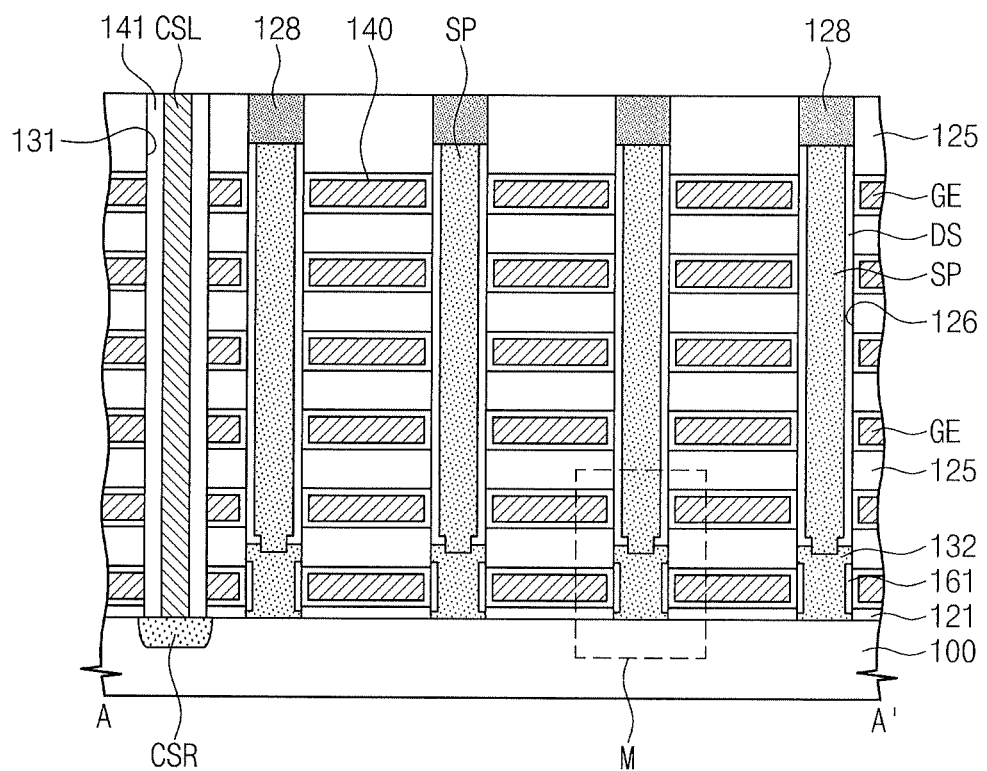
FIG. 5B is a cross-sectional view taken along the line A-A' of FIG. 5A.
Figure 5C:
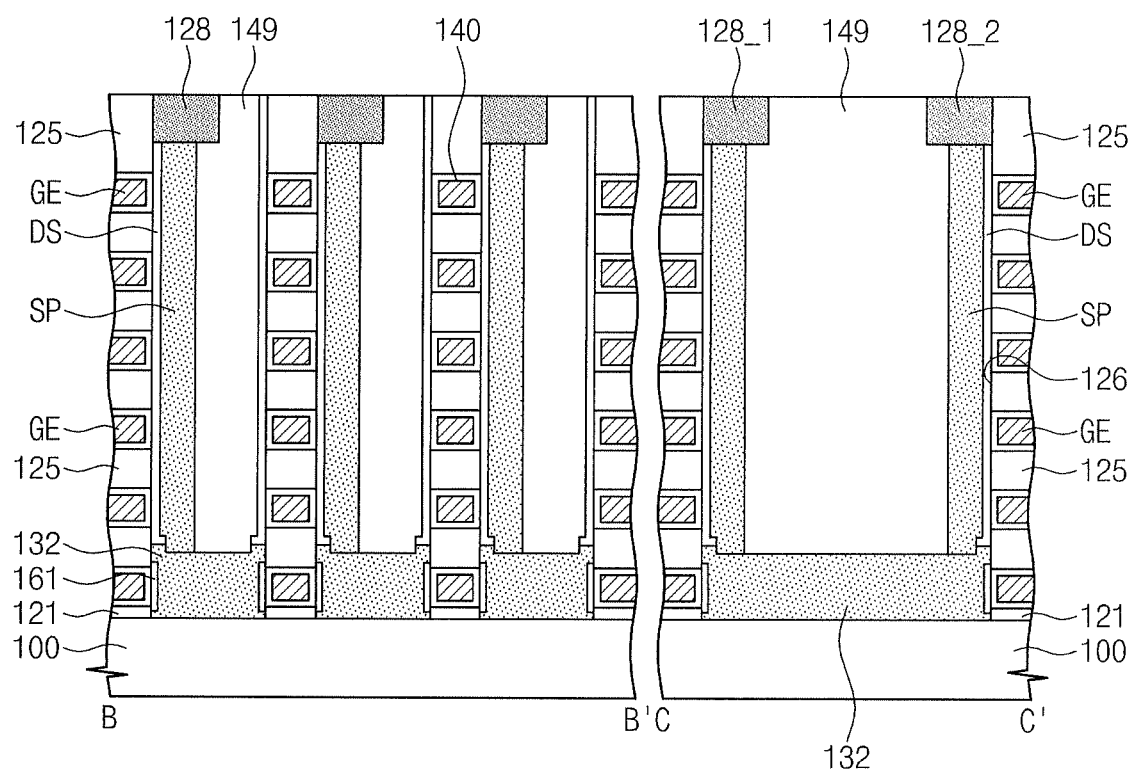
FIG. 5C shows cross-sectional views taken along the lines B-B' and C-C' of FIG. 5A.

FIG. 5A is a plan view illustrating a semiconductor device according to some embodiments of the inventive concepts. FIG. 5B is a cross-sectional view taken along the line A-A' of FIG. 5A. FIG. 5C shows cross-sectional views taken along the lines B-B' and C-C' of FIG. 5A.

Referring to FIGS. 5A, 5B, and 5C, electrode structures ES may be provided on a substrate 100. The substrate 100 may be a semiconductor substrate having a first conductivity type (e.g., a P-type). The semiconductor substrate may include a single-crystalline silicon layer, a silicon on insulator (SOI), a silicon layer formed on a silicon-germanium (SiGe) layer, a single-crystalline silicon layer formed on an insulating layer, or a poly-crystalline silicon layer formed on an insulating layer. A buffer dielectric layer 121 may be provided on the substrate 100. For example, the buffer dielectric layer 121 may include a silicon oxide layer. Each of the electrode structures ES may include a plurality of gate electrodes GE sequentially provided or stacked on the substrate 100.

The electrode structures ES may extend in a second direction D2. The electrode structures ES may be spaced apart from each other in a first direction D1 by an isolation trench 131 extending in the second direction D2. The first direction D1 may intersect (e.g., be perpendicular to) the second direction D2. An isolation insulating pattern 141 may be provided in the isolation trench 131. The isolation trench 131 may be provided in plurality. The isolation trenches 131 and the electrode structures ES may be alternately arranged in the first direction D1. For example, the isolation insulating patterns 141 may include at least one of silicon oxide, silicon nitride, or silicon oxynitride.

Insulating patterns 125 may be provided between the gate electrodes GE. The lowermost one of the gate electrodes GE may correspond to a gate electrode of a ground selection transistor (i.e., at least a portion of the ground selection line GSL of FIG. 3), and the uppermost one of the gate electrodes GE may correspond to a gate electrode of a string selection transistor (i.e., at least a portion of one of the string selection lines SSL0 to SSL2 of FIG. 3). The gate electrodes GE between the lowermost gate electrode and the uppermost gate electrode may correspond to cell gate electrodes (i.e., the word lines WL0 to WL3 of FIG. 3).

For example, the insulating patterns 125 may include silicon oxide. The buffer dielectric layer 121 may be thinner than the insulating patterns 125. The gate electrodes GE may include doped silicon, a metal (e.g., tungsten), a metal nitride, a metal silicide, or any combination thereof. Six gate electrodes are illustrated in FIGS. 5B and 5C. However, embodiments of the inventive concepts are not limited thereto. In certain embodiments, the number of the gate electrodes GE included in the electrode structure ES may be seven or more or may be five or less.

Vertical blocks VB may penetrate the gate electrodes GE so as to be connected to the substrate 100. The vertical blocks VB may be provided in openings 126 exposing the substrate 100, respectively. In a plan view, each of the openings 126 may include a linear region extending in the first direction D1, and extending regions protruding from both sidewalls of the linear region in the second direction D2 and/or a direction opposite to the second direction D2. In some embodiments, a plurality of the extending regions may be disposed along the sidewall of one linear region.

Each of the vertical blocks VB may include a filling insulation pattern 149 disposed in the linear region and channel patterns SP disposed in the extending regions along the perimeter of the filling insulation pattern 149. The channel patterns SP may be regions in which channels of MOS transistors are formed. Shapes of the vertical blocks VB may be the same as described with reference to FIG. 4. In some embodiments, the filling insulation pattern 149 may have a plate shape that extends in the first direction D1 and is substantially perpendicular to a top surface of the substrate 100. Pads 128 to be described later are omitted in a region 'OP' of FIG. 5A to illustrate the channel patterns SP disposed thereunder. The channel patterns SP may protrude from a sidewall of the filling insulation pattern 149 in the second direction D2 or a direction opposite to the second direction D2. For example, the filling insulation pattern 149 may include at least one of silicon oxide, silicon nitride, or silicon oxynitride. Each of the channel patterns SP may have, but not limited to, a semi-cylindrical shape. For example, the channel patterns SP may include at least one of silicon (Si), germanium (Ge), or silicon-germanium (SiGe). In some embodiments, the channel patterns SP may be in a poly-crystalline state. For example, the channel patterns SP may include poly-crystalline silicon. The channel patterns SP may be semiconductor patterns having the first conductivity type, e.g., P-type semiconductor patterns. However, embodiments of the inventive concepts are not limited thereto.

In a plan view, the channel patterns SP may constitute a first column and a second column which are spaced apart from each other with the filling insulation pattern 149 interposed therebetween. The channel patterns SP1 of the first column may be arranged in the first direction D1, and the channel patterns SP2 of the second column may be arranged in the first direction D1. As illustrated in FIG. 5A, the channel patterns SP2 of the second column may be shifted in the first direction D1 from the channel patterns SP1 of the first column adjacent to the second column, respectively. In other words, the channel patterns SP connected to one filling insulation pattern 149 may be arranged in a zigzag form in the first direction D1 around the perimeter of the filling insulation pattern. In certain embodiments, the channel patterns SP1 of the first column and the channel patterns SP2 of the second column may be mirror-symmetric with respect to the filling insulation pattern 149 interposed therebetween.

Each of the vertical blocks VB may further include a lower semiconductor pattern 132 disposed between the substrate 100 and the channel patterns SR In some embodiments, the lower semiconductor pattern 132 may include a layer grown by an epitaxial process using the substrate 100 as a seed. For example, the lower semiconductor pattern 132 may include at least one of silicon (Si), germanium (Ge), or silicon-germanium (SiGe). The lower semiconductor pattern 132 may extend in the first direction D1 corresponding to the extending direction of the filling insulation pattern 149.

The lower semiconductor pattern 132 may be connected in common to the channel patterns SP included in each of the vertical blocks VB. In other words, the lower semiconductor pattern 132 may be disposed between the substrate 100 and the filling insulation pattern 149 and may extend between the substrate 100 and the channel patterns SP so as to be in contact with bottom surfaces of the channel patterns SP. A top surface of the lower semiconductor pattern 132 may be higher than a top surface of the lowermost gate electrode and may be lower than a bottom surface of the second lowermost gate electrode.

A data storage layer DS may be provided between the gate electrodes GE and the channel patterns SP. In some embodiments, the data storage layer DS may extend along outer surfaces of the filling insulation pattern 149 and the channel patterns SP adhered to the filling insulation pattern 149 when viewed from a plan view. In other words, the data storage layer DS may have a closed loop shape surrounding each of the vertical blocks VB when viewed from a plan view.

The data storage layer DS may be defined to correspond to a portion of the vertical block VB. However, embodiments of the inventive concepts are not limited thereto. In some embodiments, the data storage layer DS may vertically extend along the outer surfaces of the filling insulation pattern 149 and the channel patterns SP. In this case, the channel patterns SP may be spaced apart from the insulating patterns 125 with the data storage layer DS interposed therebetween. A horizontal insulating layer 140 may be disposed between the gate electrodes GE and the insulating patterns 125 and between the data storage layer DS and the gate electrodes GE. The horizontal insulating layer 140 may extend onto top and bottom surfaces of each of the gate electrodes GE. For example, the horizontal insulating layer 140 may include at least one of a silicon oxide ($SiO_2$) layer or a high-k dielectric layer (e.g., an aluminum oxide ($Al_2O_3$) layer or a hafnium oxide ($HfO_2$) layer).

The channel patterns SP may penetrate the data storage layer DS so as to be connected to the lower semiconductor pattern 132. In some embodiments, a recess region may penetrate the data storage layer DS and may extend into an upper portion of the lower semiconductor pattern 132, and the channel patterns SP may be connected to the lower semiconductor pattern 132 through the recess region.

A gate oxide layer 161 may be provided between the lower semiconductor pattern 132 and the lowermost gate electrode GE. For example, the gate oxide layer 161 may include a silicon oxide layer or a silicon-germanium oxide layer. The lowermost gate electrode GE may correspond to the gate electrode of the ground selection transistor GST as described above, and the lower semiconductor pattern 132 may correspond to an active region of the ground selection transistor GST. Bit lines BL may be provided on the channel patterns SP. The bit lines BL are illustrated on some of the channel patterns SP in FIG. 5A to explain structures disposed thereunder.

The bit lines BL may extend in the first direction D1 and may be electrically connected to the channel patterns SP disposed thereunder. In some embodiments, contacts (not shown) may be provided to electrically connect the channel patterns SP to the bit lines BL. In some embodiments, sub-bit lines (not shown) may be provided to extend in the first direction D1 between the contacts and the bit lines BL. The bit lines BL may include at least one of a metal, a conductive metal nitride, or a doped semiconductor material.

Pads 128 may be provided on the channel patterns SP, respectively. Each of the pads 128 may include a portion overlapping with the channel pattern SP and a portion overlapping with the filling insulation pattern 149. In other words, the pads 128 may extend from top surfaces of the channel patterns SP onto the filling insulation pattern 149. In some embodiments, the channel patterns SP spaced apart from each other with the filling insulation pattern 149 interposed therebetween may protrude in directions opposite to each other, as illustrated in FIG. 5C. Thus, a first pad 128_1 of FIG. 5C may laterally protrude from the channel pattern SP disposed thereunder in one direction, and a second pad 128_2 of FIG. 5C may laterally protrude from the channel pattern SP disposed thereunder in a direction opposite to the one direction. The pads 128 may include at least one of a doped semiconductor material, a metal, a metal silicide, or a metal nitride.

Common source regions CSR may be provided in the substrate 100 under the isolation insulating patterns 141. The common source regions CSR may be regions doped with dopants of a second conductivity type different from the first conductivity type. For example, the common source regions CSR may be N-type dopant regions. Common source lines CSL may penetrate the isolation insulating patterns 141 so as to be connected to the common source regions CSR. Each of the common source lines CSL may have a plate shape that extends along the common source region CSR and is substantially perpendicular to the top surface of the substrate 100.

For example, the common source lines CSL may include tungsten. However, embodiments of the inventive concepts are not limited thereto. In certain embodiments, the common source lines CSL may include at least one of a metal (e.g., copper, titanium, or aluminum), a doped semiconductor material, or a conductive metal nitride. A plurality of the common source lines CSL may be electrically connected to each other through a source strapping line (not shown).

FIGS. 6A to 6I are plan views illustrating channel patterns SP according to some embodiments of the inventive concepts.

Figure 6A:
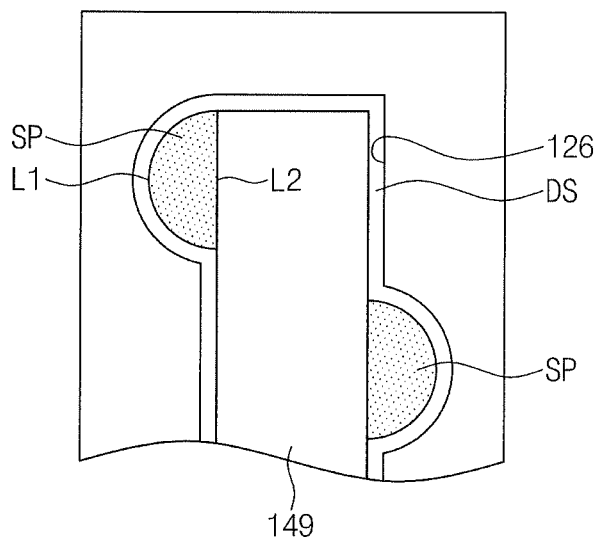
FIGS. 6A to 6I are plan views illustrating channel patterns according to some embodiments of the inventive concepts.
Figure 6B:
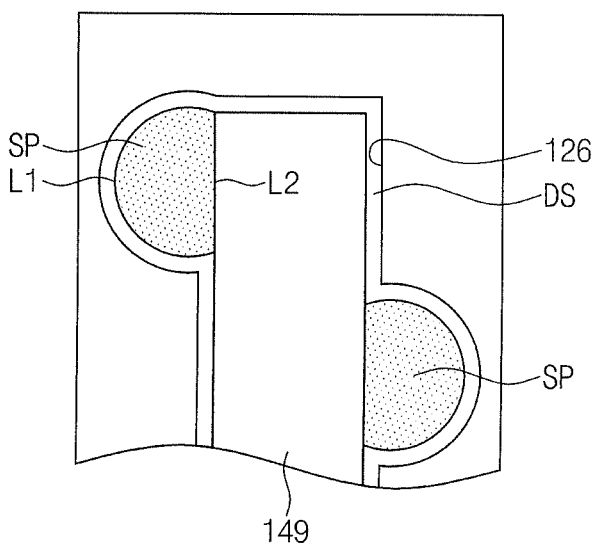
Figure 6C:
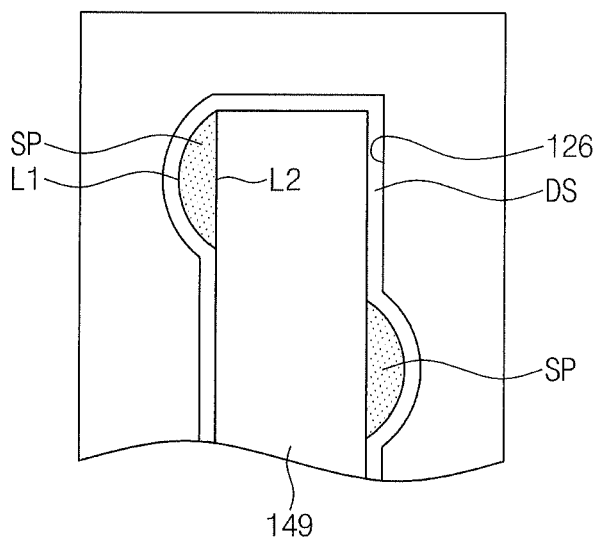
Figure 6D:
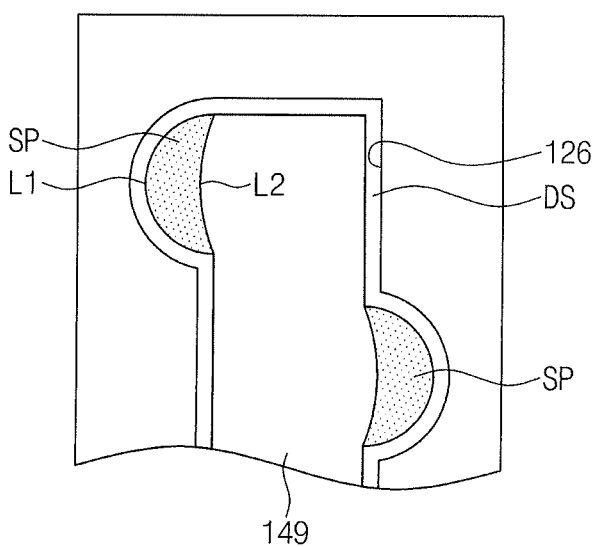
Figure 6E:
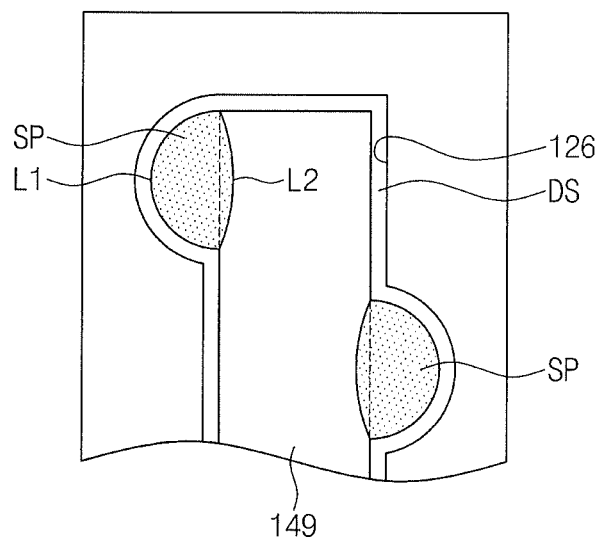

Referring to FIG. 6A, the top surface of each of the channel patterns SP may include a first line L1 and a second line L2 that define a non-circular shaped horizontal cross-section of the channel pattern SP. The first line L1 may have an arc (or curved) shape and the second line L2 may have a straight line shape and may be self-aligned to a sidewall of the insulating filling pattern 149. However, embodiments of the inventive concepts are not limited thereto. In certain embodiments, as illustrated in FIGS. 6D and 6E, the second line L2 may have an arc shape of which a radius of curvature is different from (e.g., greater than) that of the first line L1. In some embodiments, the channel pattern SP may have a semicircular shape, as illustrated in FIG. 6A. In certain embodiments, the channel pattern SP may have a shape that is a portion of a circle and is greater than a semicircle, as illustrated in FIG. 6B. In certain embodiments, the channel pattern SP may have a shape that is a portion of a circle and is smaller than a semicircle, as illustrated in FIG. 6C.

Figure 6F:
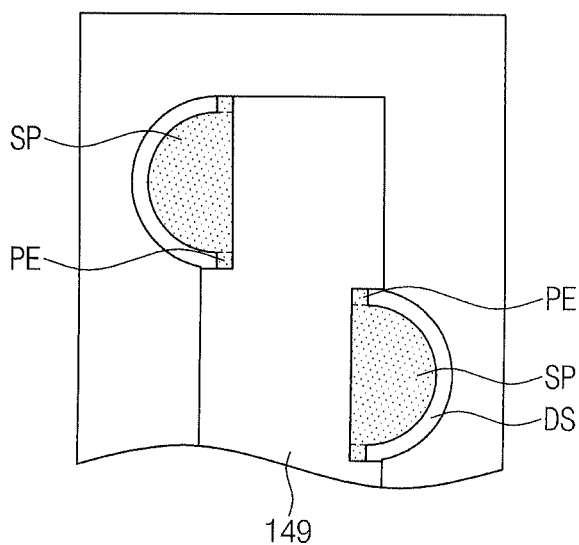
Figure 6G:
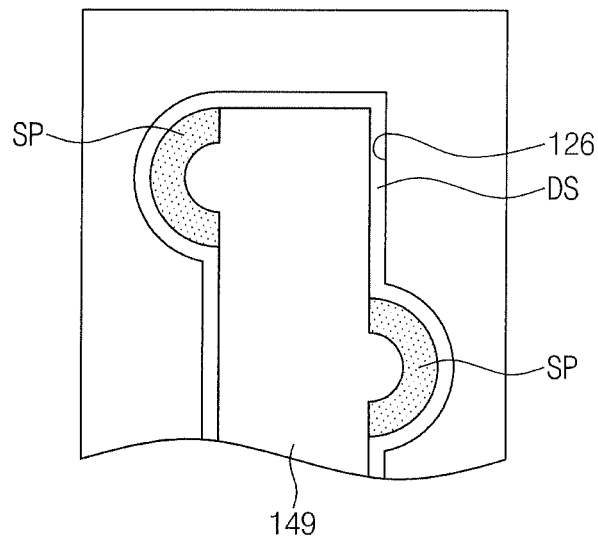
Figure 6H:
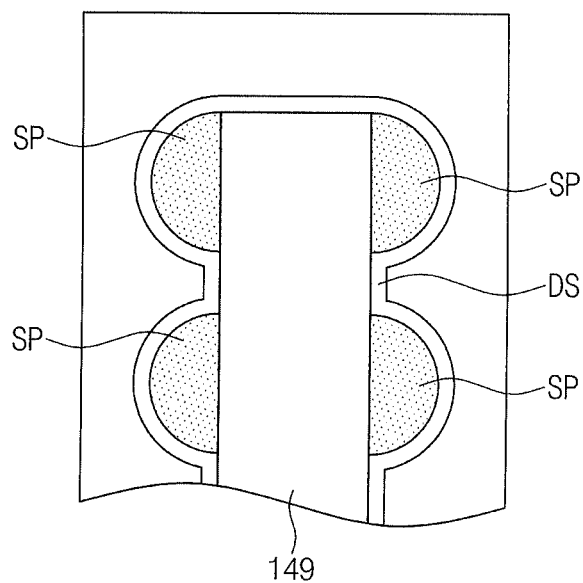
Figure 6I:
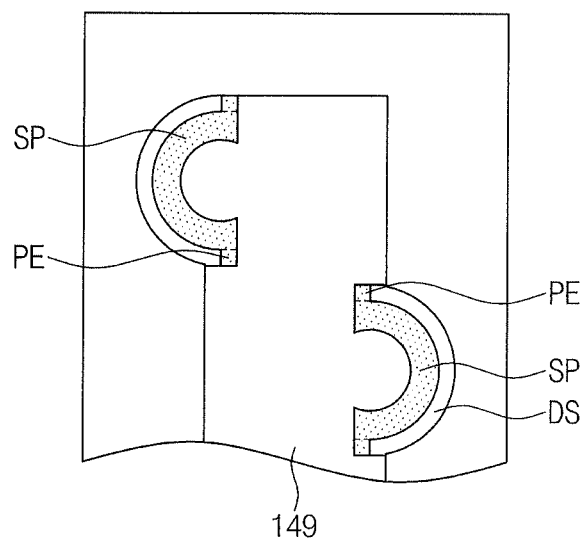

In some embodiments, the channel pattern SP may have an additional linear portion PE protruding from a semicircle, as illustrated in FIGS. 6F and 6I. In some embodiments, the data storage layer DS covering one channel pattern SP may be separated from the data storage layer DS covering another channel pattern SP. As illustrated in FIGS. 6G and 6I, the channel pattern SP may have the substantially same thickness along the data storage layer DS. In other words, the channel pattern SP may have a similar shape to a portion of a hollow cylinder. As illustrated in FIG. 6H, the channel patterns SP may be disposed to be mirror-symmetric with respect to the filling insulation pattern 149.

Figure 7A:
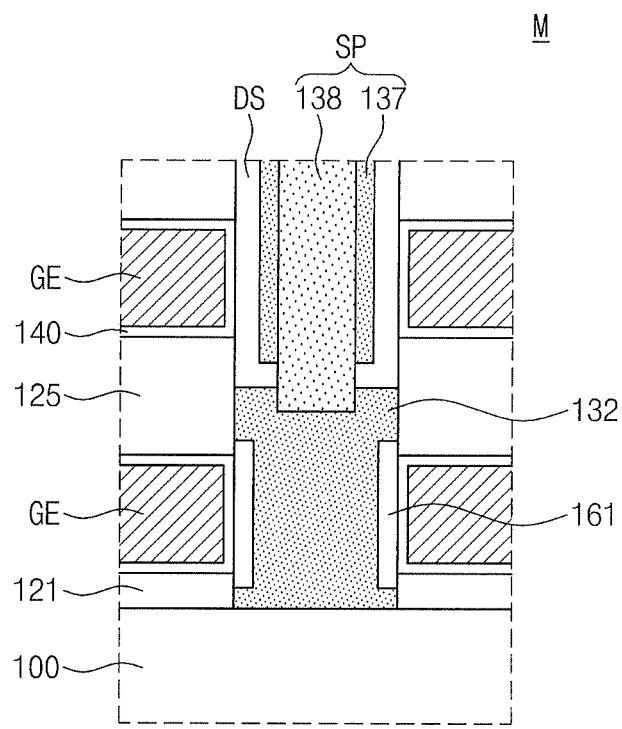
FIGS. 7A to 7C are enlarged views of the region 'M' of FIG. 5B.
Figure 7B:
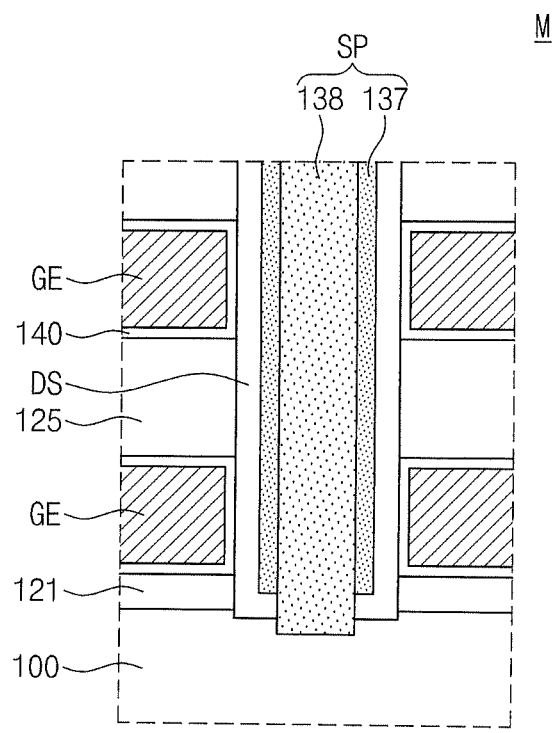
Figure 7C:
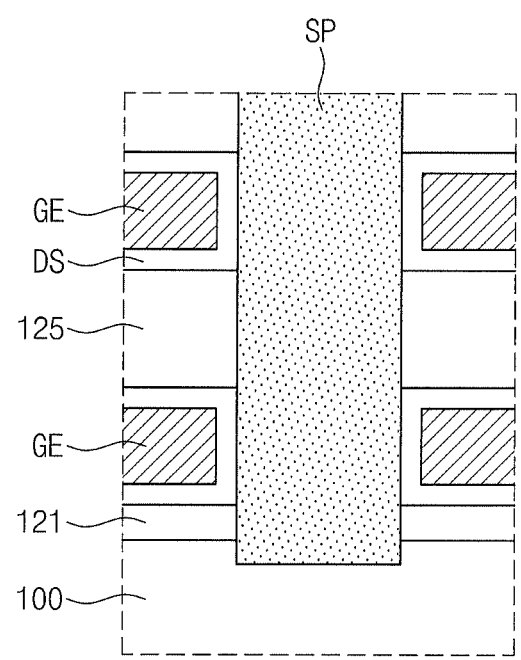

FIGS. 7A to 7C are enlarged views of the region 'M' of FIG. 5B.

Referring to FIG. 7A, the lower semiconductor pattern 132 and the channel pattern SP may be connected to each other to constitute a portion of a cell string. The channel pattern SP may include an outer pattern 137 provided on a bottom portion of the data storage layer DS, and an inner pattern 138 penetrating the outer pattern 137 and the data storage layer DS to extend into the upper portion of the lower semiconductor pattern 132. The outer pattern 137 and the inner pattern 138 may be formed of the same material.

The data storage layer DS may include a blocking insulating layer adjacent to the gate electrode GE, a tunnel insulating layer adjacent to the channel pattern SP, and a charge storage layer between the blocking insulating layer and the tunnel insulating layer. The blocking insulating layer may include a high-k dielectric layer (e.g., an aluminum oxide layer or a hafnium oxide layer). In some embodiments, the blocking insulating layer may include a plurality of layers. In this case, the blocking insulating layer may include a first blocking insulating layer and a second blocking insulating layer. For example, the first blocking insulating layer and the second blocking insulating layer may include an aluminum oxide layer and a hafnium oxide layer, respectively.

The charge storage layer may include a charge trap layer or an insulating layer including conductive nano-particles. The charge trap layer may include, for example, a silicon nitride layer. The tunnel insulating layer may include a silicon oxide layer. The tunnel insulating layer may further include a high-k dielectric layer (e.g., an aluminum oxide layer or a hafnium oxide layer).

In certain embodiments, the data storage layer DS may be a variable resistance pattern. The variable resistance pattern may include at least one of materials having changeable resistance characteristics. Hereinafter, embodiments of the variable resistance pattern used as the data storage layer DS will be described.

In some embodiments, the data storage layer DS may include a material (e.g., a phase-change material) of which an electrical resistance is changeable by heat generated using a current passing through an electrode adjacent thereto. In certain embodiments, the data storage layer DS may have a thin layer structure of which an electrical resistance is changeable using spin transfer torque of electrons of a current passing therethrough. In certain embodiments, the data storage layer DS may include at least one of perovskite compounds or transition metal oxides.

In some embodiments, as illustrated in FIG. 7B, the lower semiconductor pattern 132 may not be provided. In this case, the channel pattern SP may be connected directly to an upper portion of the substrate 100. In some embodiments, as illustrated in FIG. 7C, the data storage layer DS may extend from between the gate electrode GE and the channel pattern SP into between the gate electrode GE and the insulating patterns 125. In this case, the channel pattern SP may be in contact with the insulating patterns 125.

FIGS. 8A to 13A are plan views illustrating a method of manufacturing a semiconductor device according to some embodiments of the inventive concepts. FIGS. 8B to 13B are cross-sectional views taken along the lines A-A' of FIGS. 8A to 13A, respectively. FIGS. 8C to 13C are cross-sectional views taken along the lines B-B' of FIGS. 8A to 13A, respectively. Hereinafter, a method of manufacturing the semiconductor device of FIGS. 5A to 5C will be described as an example for the purpose of ease and convenience in explanation.

Figure 8A:
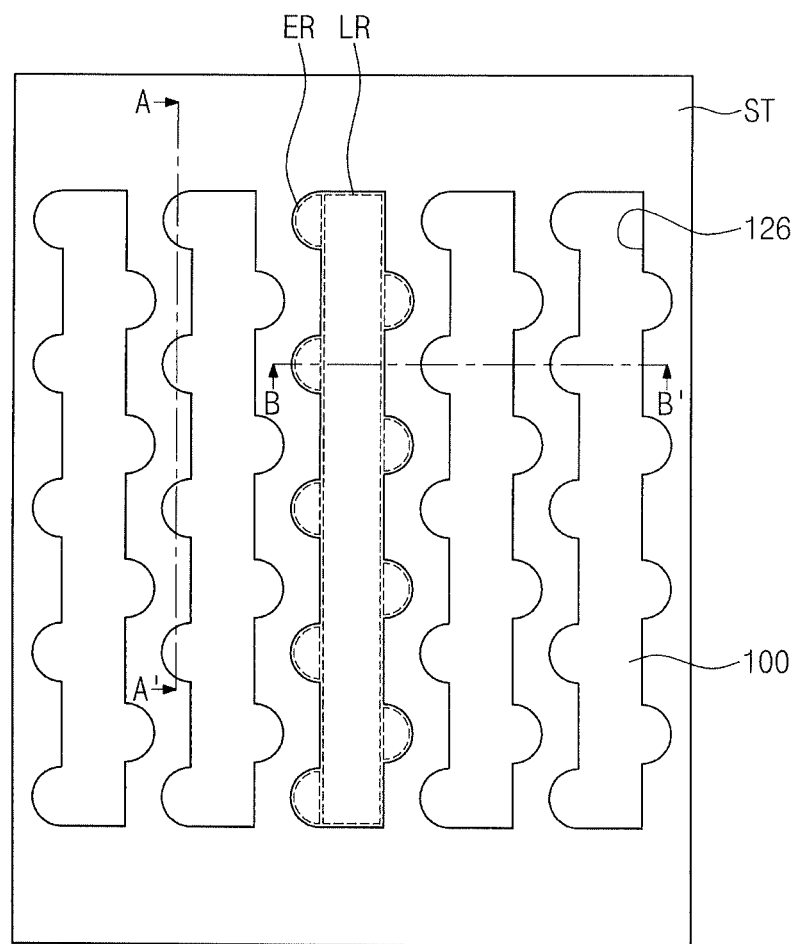
Figure 8B:
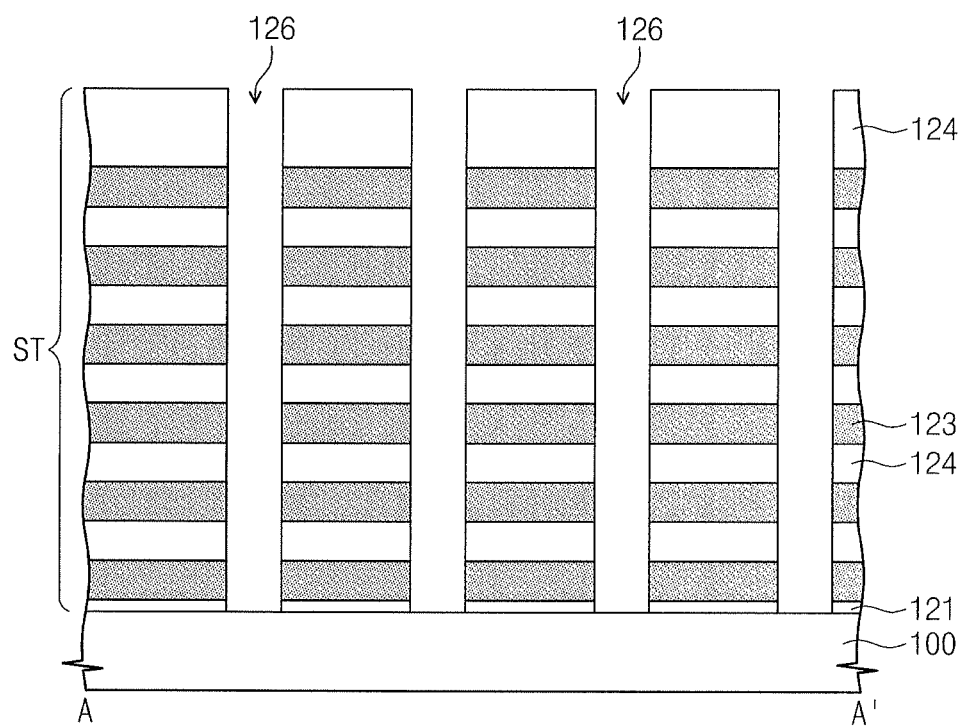
Figure 8C:
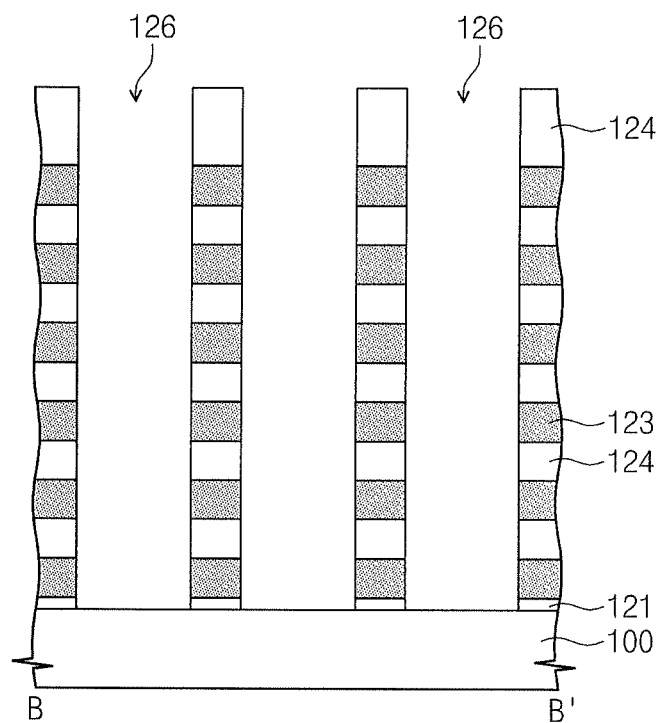

Referring to FIGS. 8A, 8B, and 8C, a substrate 100 may be provided. The substrate 100 may have a first conductivity type (e.g., a P-type). A stack structure ST may be formed on the substrate 100. The stack structure ST may include a buffer dielectric layer 121 corresponding to the lowermost layer thereof. For example, the buffer dielectric layer 121 may include a silicon oxide layer. The buffer dielectric layer 121 may be formed by, for example, a thermal oxidation process. The stack structure ST may include sacrificial layers 123 and insulating layers 124 which are alternately and repeatedly stacked on the buffer dielectric layer 121.

A thickness of the uppermost one of the insulating layers 124 may be greater than those of others of the insulating layers 124. For example, each of the insulating layers 124 may include a silicon oxide layer. The sacrificial layers 123 may include a material of which an etch rate by a specific etchant is higher than those of the buffer dielectric layer 121 and the insulating layers 124. For example, each of the sacrificial layers 123 may include at least one of a silicon nitride layer, a silicon oxynitride layer, a poly-silicon layer, or a poly-silicon-germanium layer. The sacrificial layers 123 and the insulating layers 124 may be formed using, for example, a chemical vapor deposition (CVD) method.

Openings 126 may be formed to penetrate the stack structure ST. The openings 126 may expose the substrate 100. The openings 126 may be formed using an anisotropic etching process. In a plan view, each of the openings 126 may include a linear region LR extending in a first direction D1, and extending regions ER protruding from both sidewalls of the linear region LR in a second direction D2 and/or a direction opposite to the second direction D2. The second direction D2 may be perpendicular to the first direction D1. In some embodiments, a plurality of the extending regions ER may be arranged along the sidewall of one linear region LR. A shape of each of the extending regions ER may be a half circle (or a semicircle) in a plan view. However, embodiments of the inventive concepts are not limited thereto. In certain embodiments, the planar shape of each of the extending regions ER in a plan view may be variously modified as illustrated in FIGS. 6A to 6I.

Figure 9A:
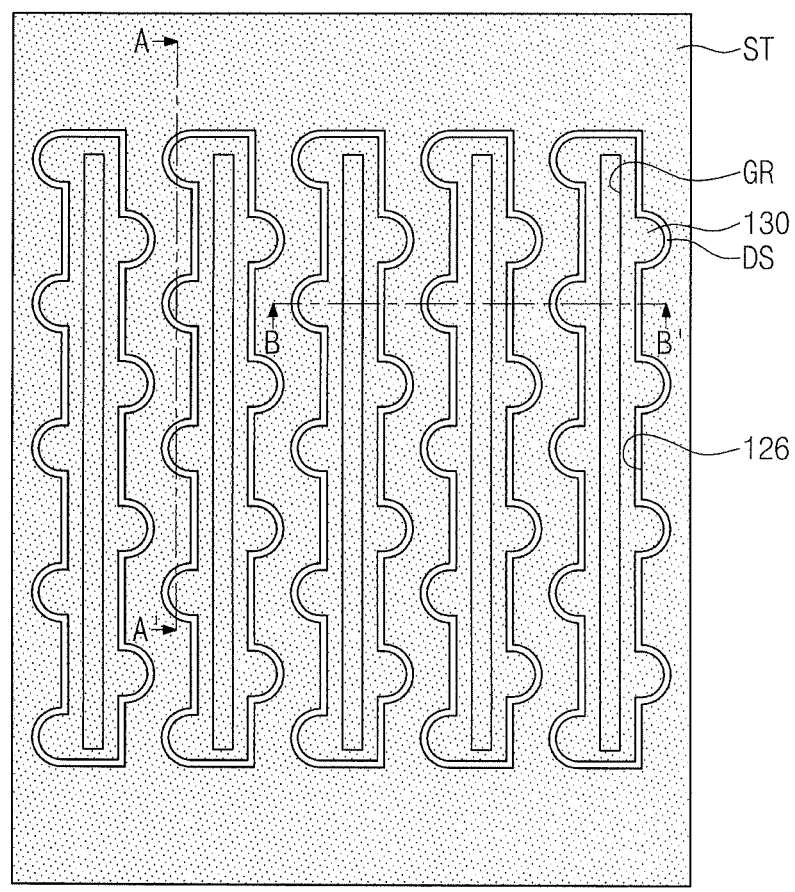
Figure 9A:
Figure 9B:
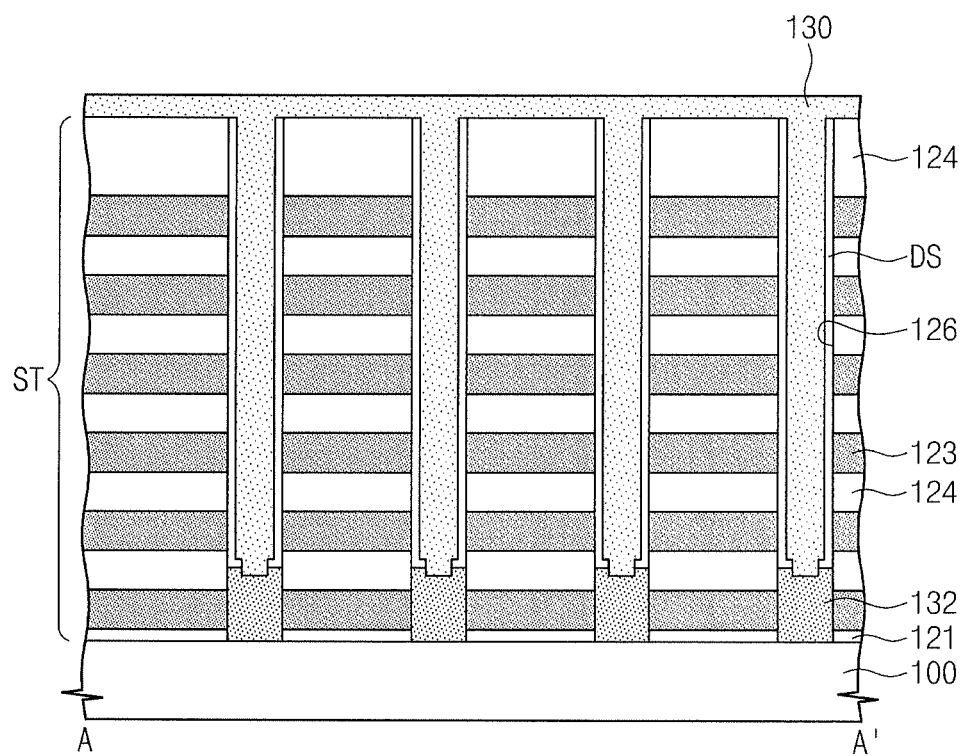
Figure 9C:
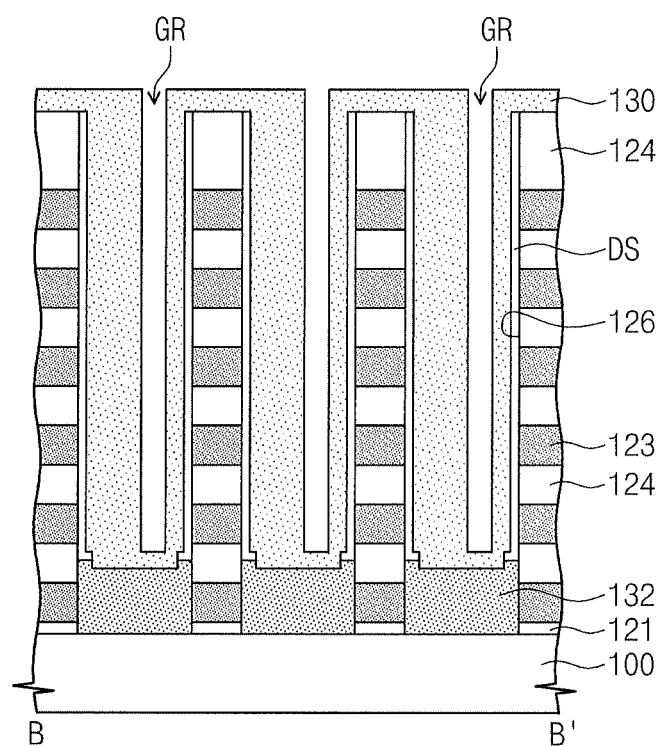

Referring to FIGS. 9A, 9B, and 9C, lower semiconductor patterns 132 may be formed in lower regions of the openings 126, respectively. In some embodiments, the lower semiconductor pattern 132 may be formed by an epitaxial process using a top surface of the substrate 100 as a seed. The lower semiconductor pattern 132 may be formed such that its top surface is disposed at a level between a top surface of the lowermost one and a bottom surface of the second lowermost one of the sacrificial layers 123. In some embodiments, the lower semiconductor pattern 132 may be formed of a substantially single-crystalline silicon layer. In certain embodiments, the process of forming the lower semiconductor pattern 132 may be omitted.

A data storage layer DS may be formed in the openings 126. The data storage layer DS may be substantially conformally formed along a sidewall and a bottom surface of each of the openings 126. The data storage layer DS may include a blocking insulating layer, a charge storage layer, and a tunnel insulating layer which are sequentially formed on the sidewall of each of the openings 126. In some embodiments, the blocking insulating layer may include a plurality of layers. For example, the blocking insulating layer may include a hafnium oxide layer, an aluminum oxide layer, and/or a silicon oxide layer. A stacking order of the hafnium oxide layer, the aluminum oxide layer, and the silicon oxide layer may be variously modified in the blocking insulating layer. The charge storage layer may be formed on the blocking insulating layer. The charge storage layer may be formed by an atomic layer deposition (ALD) method. The charge storage layer may include a charge trap layer or an insulating layer including conductive nano-particles. The charge trap layer may include, for example, a silicon nitride layer. The tunnel insulating layer may be formed on the charge storage layer. For example, the tunnel insulating layer may include a silicon oxide layer.

In certain embodiments, at least one of the blocking insulating layer, the charge storage layer, and the tunnel insulating layer of the data storage layer DS may be omitted in the present process and will be formed before formation of gate electrodes GE to be described later.

A semiconductor layer 130 may be formed on the substrate 100. The semiconductor layer 130 may penetrate the data storage layer DS so as to be connected to the lower semiconductor pattern 132. In some embodiments, a spacer layer may be formed on the data storage layer DS, and an anisotropic etching process may be performed on the spacer layer to form an outer pattern 137 of FIG. 7A on the sidewall of each of the openings 126. The outer pattern 137 may have a spacer shape. The outer pattern 137 may be formed of a semiconductor material. For example, the outer pattern 137 may include silicon. The outer pattern 137 may expose the lower semiconductor pattern 132. A through-hole exposing the lower semiconductor pattern 132 may be formed in a bottom portion of the data storage layer DS by the anisotropic etching process, and a recess region may also be formed in an upper portion of the lower semiconductor pattern 132 by the anisotropic etching process.

As illustrated in FIG. 7A, an inner pattern 138 may be formed on the outer pattern 137. The inner pattern 138 may include the same material as the outer pattern 137. In some embodiments, the outer pattern 137 and the inner pattern 138 may be formed using a CVD method. The process of forming the outer pattern 137 and the inner pattern 138 may include at least one thermal treatment process.

The semiconductor layer 130 may not completely fill the openings 126, and thus gap regions GR may be defined in the openings 126 by inner sidewalls of the semiconductor layer 130, respectively. The gap regions GR may extend along the openings 126 in the first direction D1. In some embodiments, each of the gap regions GR may extend between the extending regions ER of each of the openings 126. The semiconductor layer 130 may completely fill the extending regions ER but may partially fill the linear region LR. This shape of the semiconductor layer 130 may be due to the shapes of the openings 126. In other words, since the extending regions ER are narrower than the linear regions LR, a deposition rate of the semiconductor layer 130 in the extending regions ER may be higher than that of the semiconductor layer 130 in the linear regions LR.

Figure 10A:
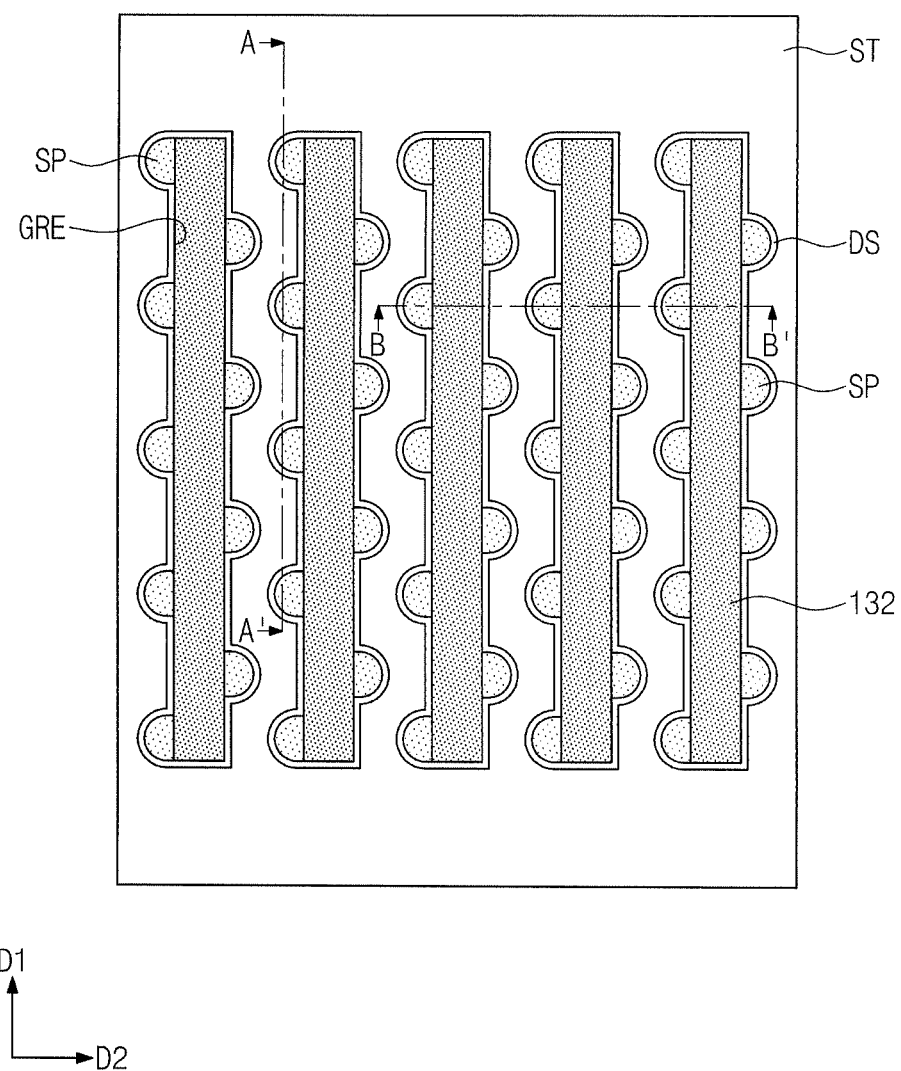
Figure 10B:
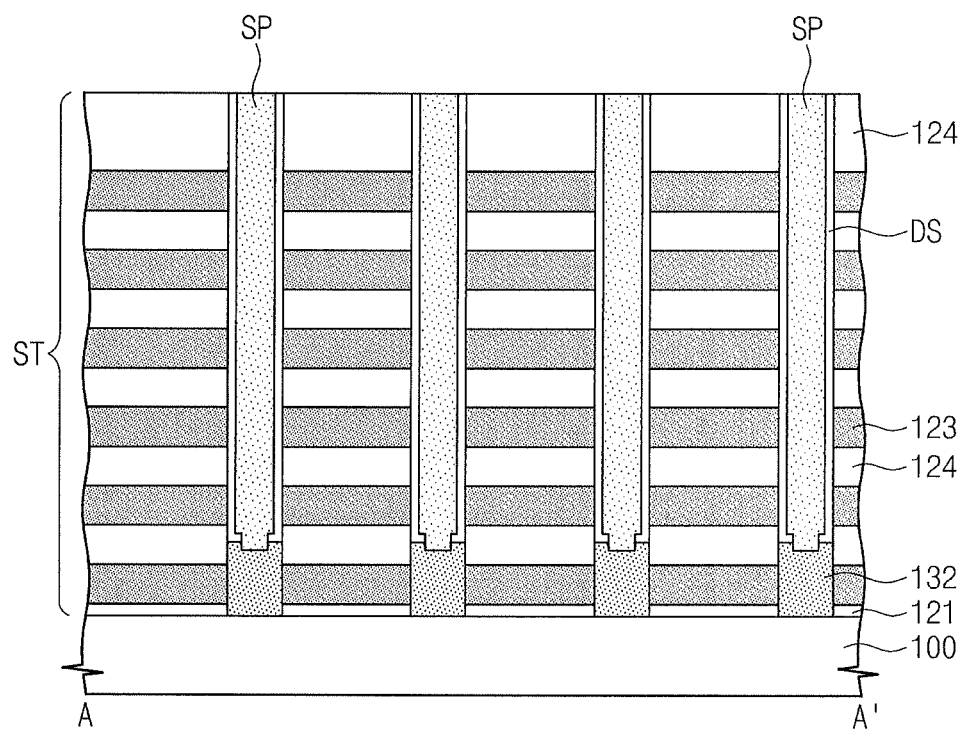
Figure 10C:
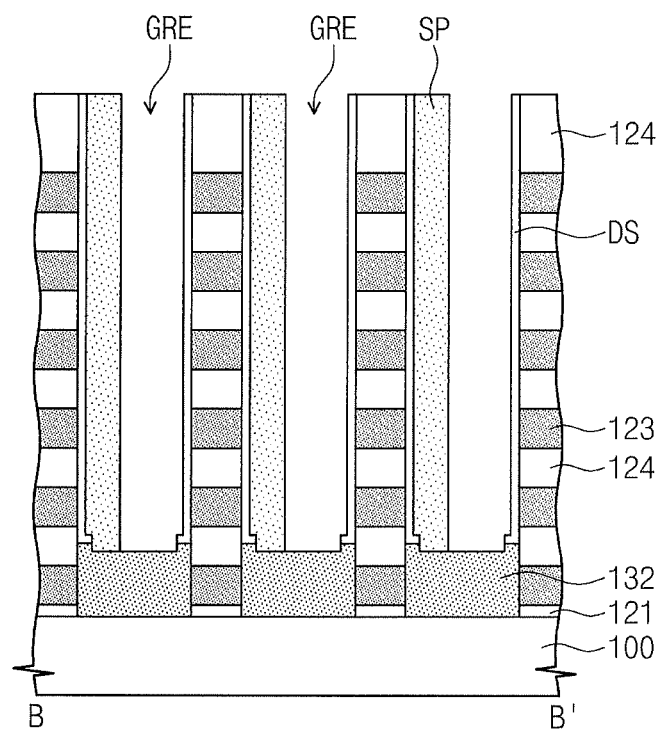

Referring to FIGS. 10A, 10B, and 10C, the semiconductor layer 130 may be etched to form channel patterns SP in the extending regions ER, respectively. In some embodiments, an isotropic etching process may be performed on the semiconductor layer 130 to form extended gap regions GRE. The extended gap regions GRE may correspond to gap regions GR enlarged by the isotropic etching process. The extended gap regions GRE may expose a sidewall of the data storage layer DS and a top surface of the lower semiconductor pattern 132. The semiconductor layer 130 disposed on the uppermost insulating layer 124 may be removed by the isotropic etching process. The channel patterns SP may have semi-cylindrical shapes. However, embodiments of the inventive concepts are not limited thereto. In certain embodiments, the shapes of the channel patterns SP may be variously modified according to a manner of the etching process. In some embodiments, the data storage layer DS between the channel patterns SP may not be etched. Unlike FIGS. 10A to 10C, the data storage layer DS between the channel patterns SP may be etched, and thus portions of the data storage layer DS disposed in the extending regions ER may be separated from each other.

Figure 11A:
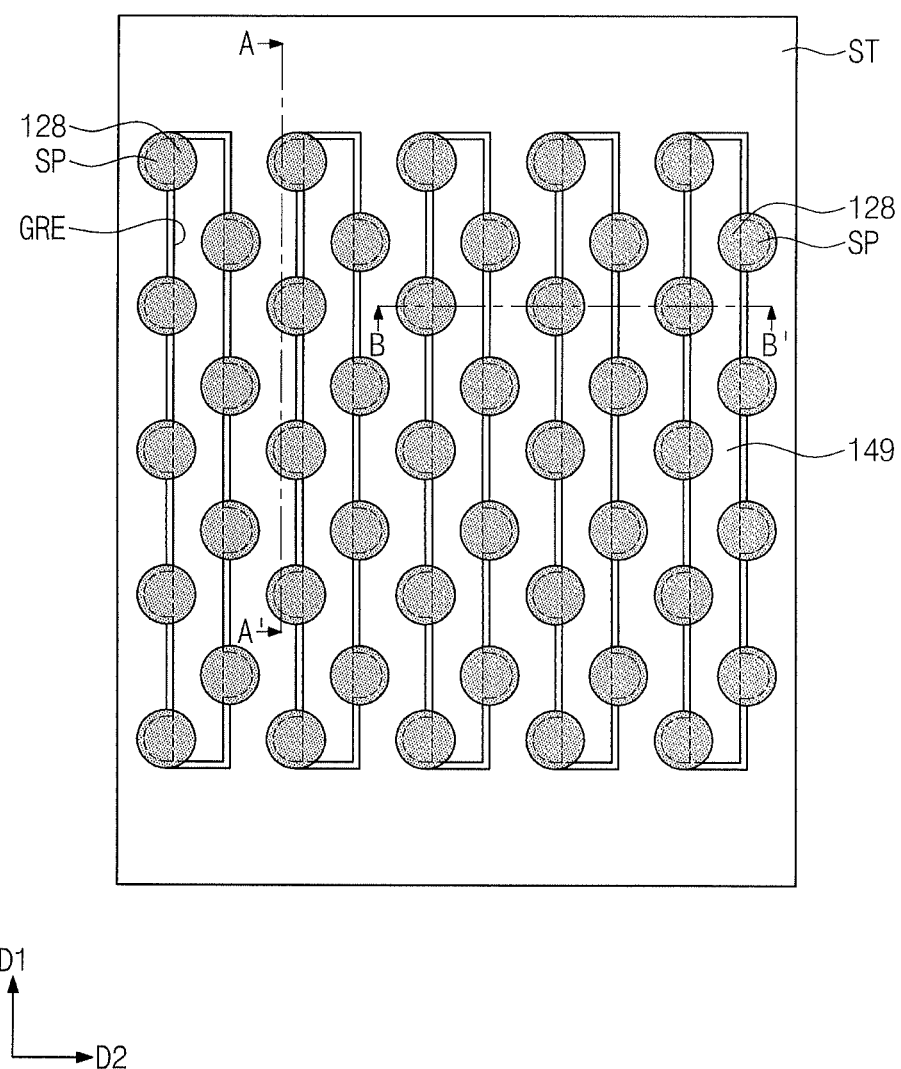
Figure 11B:
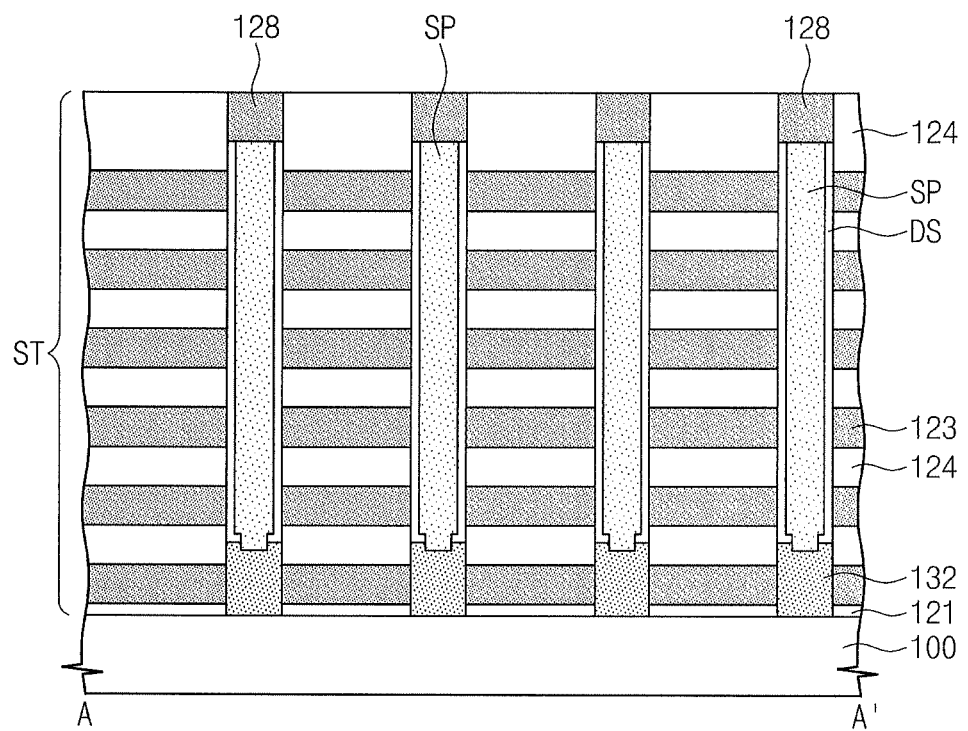
Figure 11C:
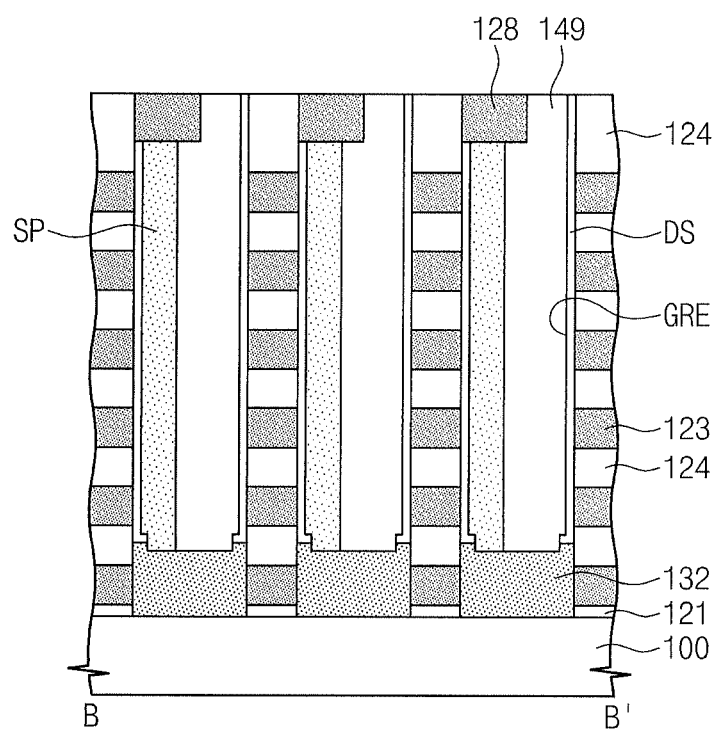

Referring to FIGS. 11A, 11B, and 11C, filling insulation patterns 149 may be formed to fill the extended gap regions GRE, respectively. The filling insulation patterns 149 may include at least one of silicon oxide or silicon oxynitride. The process of forming the filling insulation patterns 149 may include a planarization process. The filling insulation patterns 149 may include, for example, borosilicate glass (BSG), phosphosilicate glass (PSG), or borophosphosilicate glass (BPSG).

Upper portions of the channel patterns SP and portions of upper portions of the filling insulation patterns 149 may be recessed, and pads 128 may be formed in the recessed regions, respectively. In some embodiments, the data storage layer DS between the uppermost insulating layer 124 and the upper portions of the channel patterns SP may be etched together with the upper portions of the channel patterns SP. However, embodiments of the inventive concepts are not limited thereto. The pads 128 may include at least one of doped poly-silicon or a metal. Dopant ions of a second conductivity type may be implanted into the pads 128 and/or top end portions of the channel patterns SP to form drain regions (not shown). The second conductivity type may be, for example, an N-type.

The pads 128 may have circular shapes when viewed from a plan view. However, embodiments of the inventive concepts are not limited thereto. Each of the pads 128 may include a portion overlapping with the channel pattern SP disposed thereunder and a portion overlapping with the filling insulation pattern 149. In other words, the pads 128 may laterally extend from top surfaces of the channel patterns SP. In some embodiments, the channel patterns SP spaced apart from each other with the filling insulation pattern 149 interposed therebetween may protrude in directions opposite to each other, as illustrated in FIG. 5C.

Figure 12A:
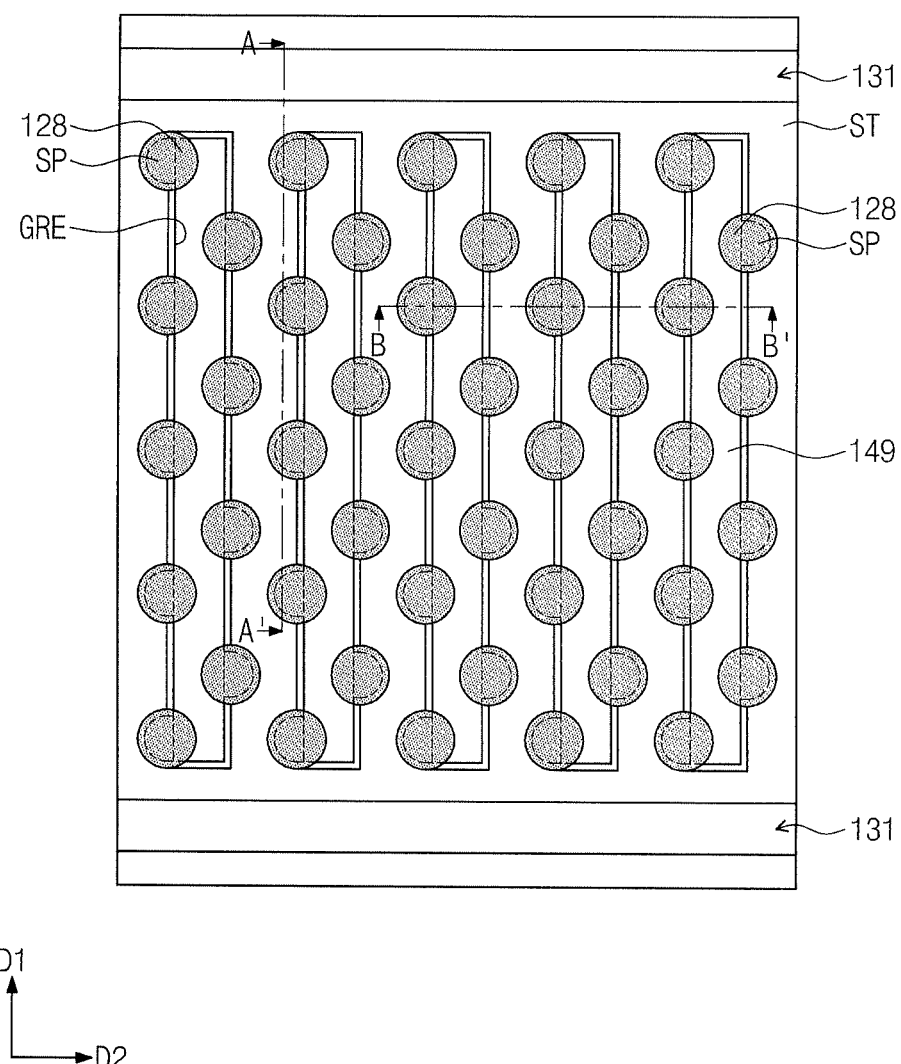
Figure 12B:
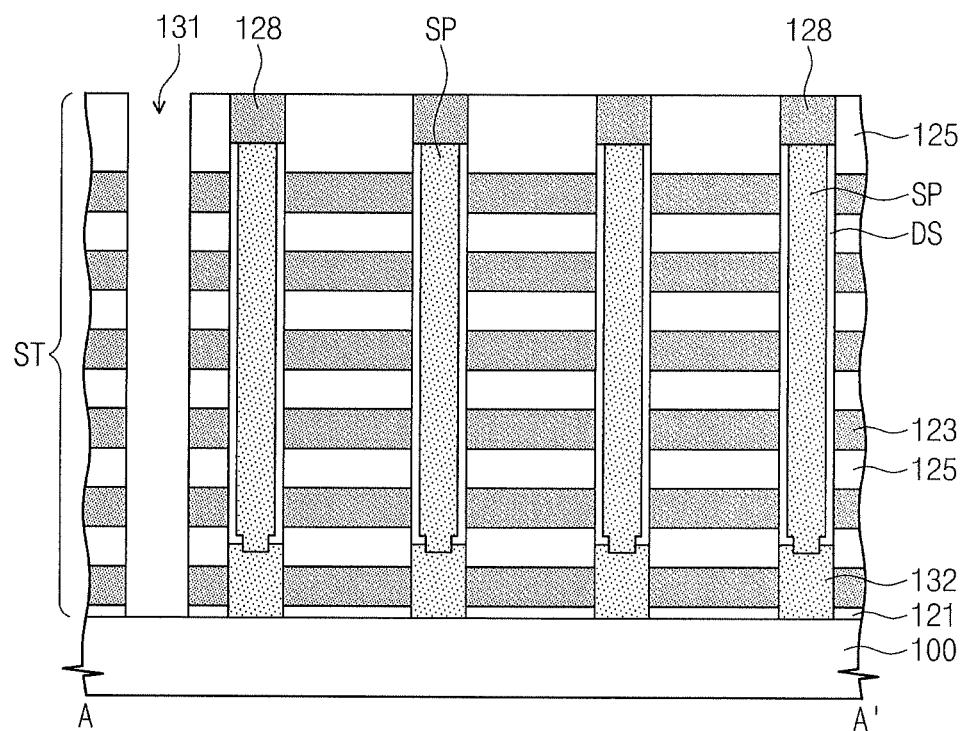
Figure 12C:
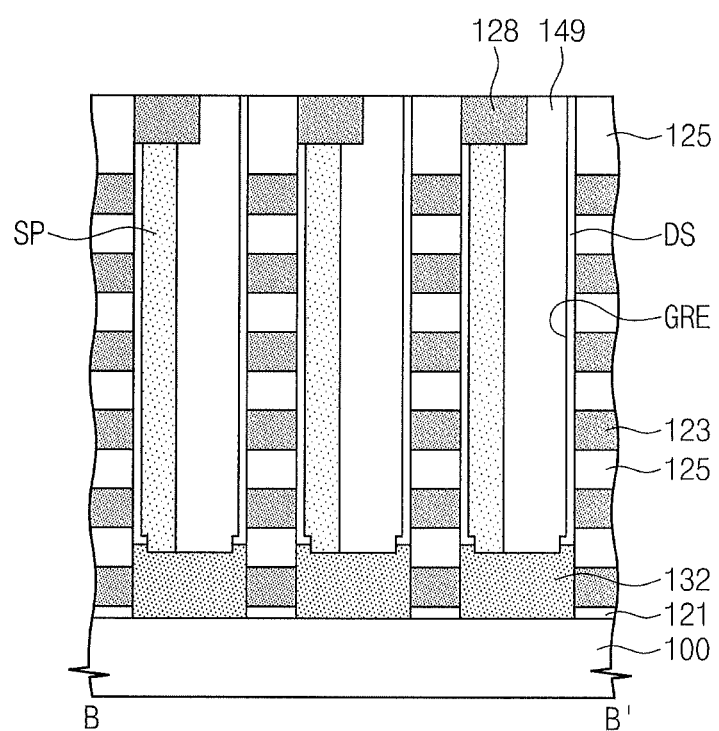

Referring to FIGS. 12A, 12B, and 12C, the stack structure ST may be patterned to form isolation trenches 131 extending in the second direction D2. The isolation trenches 131 may expose the substrate 100. The patterned insulating layers 124 may be defined as insulating patterns 125. The isolation trenches 131 may be formed using an anisotropic etching process.

Figure 13A:
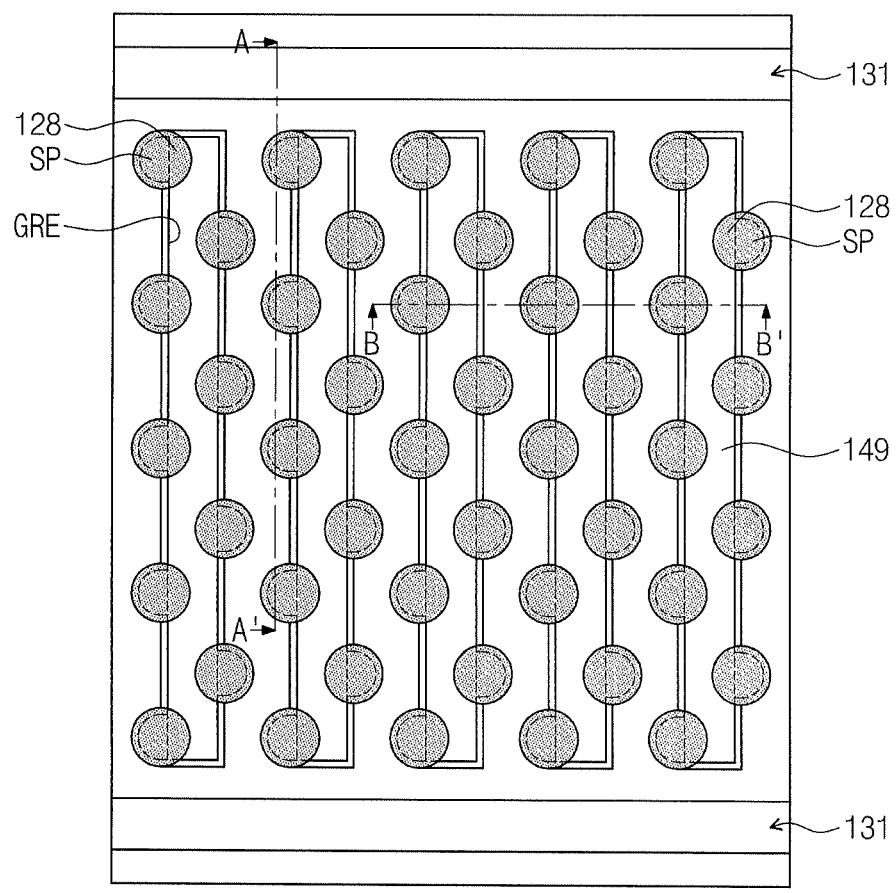
Figure 13B:
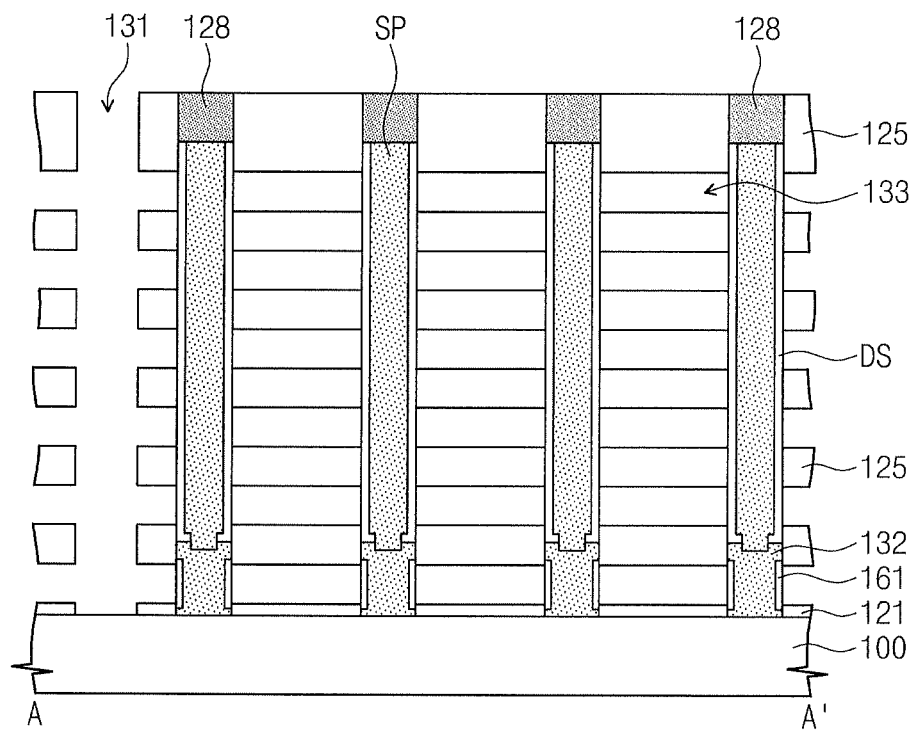
Figure 13C:
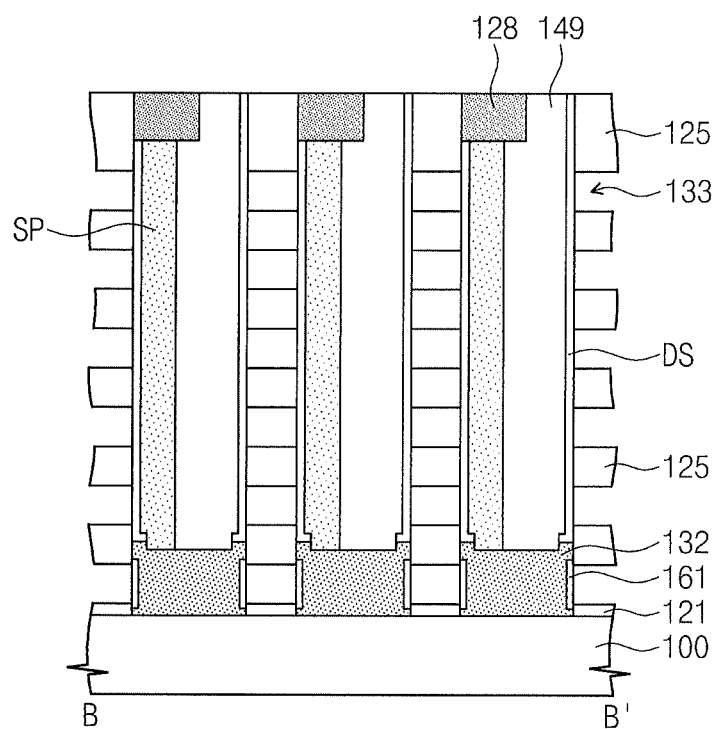

Referring to FIGS. 13A, 13B, and 13C, the sacrificial layers 123 exposed through the isolation trenches 131 may be selectively removed to form recess regions 133. The recess regions 133 may correspond to empty regions formed by removing the sacrificial layers 123. When the sacrificial layers 123 include silicon nitride or silicon oxynitride, the process of removing the sacrificial layers 123 may be performed using an etching solution including phosphoric acid. The sidewalls of the data storage layer DS and sidewalls of the lower semiconductor patterns 132 may be exposed through the recess regions 133.

The sidewalls of the lower semiconductor patterns 132, which are exposed through the recess regions 133, may be oxidized to form gate oxide layers 161. For example, the gate oxide layers 161 may be silicon oxide layers.

Referring again to FIGS. 5A, 5B, and 5C, a horizontal insulating layer 140 may be formed to cover inner surfaces of the recess regions 133 illustrated in FIGS. 13A, 13B, and 13C. The horizontal insulating layer 140 may be formed using a deposition method having an excellent step coverage property. For example, the horizontal insulating layer 140 may be formed using a CVD method or an ALD method. In some embodiments, the horizontal insulating layer 140 may include at least one of a silicon oxide ($SiO_2$) layer or a high-k dielectric layer (e.g., an aluminum oxide ($Al_2O_3$) layer or a hafnium oxide ($HfO_2$) layer). In certain embodiments, the process of forming the horizontal insulating layer 140 may be omitted.

After the formation of the horizontal insulating layer 140, a conductive layer may be formed to fill the recess regions 133. The conductive layer may include at least one of a doped silicon layer, a metal layer (e.g., a tungsten layer), a metal nitride layer, or a metal silicide layer. In some embodiments, the conductive layer may be formed by an ALD method. The conductive layer formed outside the recess regions 133 (e.g., the conductive layer formed in the isolation trenches 131) may be removed. Thus, gate electrodes GE may be formed in the recess regions 133, respectively. The gate electrodes GE may extend in the second direction D2. Electrode structures ES may include the gate electrodes GE and may be spaced apart from each other in the first direction D1 by the isolation trenches 131. After the conductive layer formed in the isolation trenches 131 is removed to expose the substrate 100, dopant ions of the second conductivity type may be implanted at a high dose into the substrate 100 disposed under the isolation trenches 131, thereby forming common source regions CSR.

Isolation insulating patterns 141 may be formed in the isolation trenches 131. The isolation insulating patterns 141 may extend along sidewalls of the isolation trenches 131 and may portions of the common source regions CSR. The formation of the isolation insulating patterns 141 may include forming an insulating layer conformally covering inner surfaces of the isolation trenches 131, and performing an anisotropic etching process on the insulating layer to expose the common source regions CSR.

Common source lines CSL may be formed to fill the isolation trenches 131, respectively. The common source lines CSL may be electrically insulated from the gate electrodes GE by the isolation insulating patterns 141. For example, the common source lines CSL may include tungsten. However, embodiments of the inventive concepts are not limited thereto. In certain embodiments, the common source lines CSL may include at least one of a metal (e.g., copper, titanium, or aluminum), a doped semiconductor material, or a conductive metal nitride. Each of the common source lines CSL may further include a barrier layer. For example, the barrier layer may include a metal (e.g., titanium or tantalum) and/or a metal nitride (e.g., titanium nitride or tantalum nitride).

Bit lines BL may be formed on the electrode structures ES. The bit lines BL may include at least one of a metal, a conductive metal nitride, or a doped semiconductor material. The channel patterns SP may be electrically connected to the bit lines BL through the pads 128 and contacts (not shown) disposed on the pads 128.

According to some embodiments of the inventive concepts, an area of the opening 126 may be wider than those of holes in which channel patterns are formed, respectively. Thus, the degree of difficulty of the etching process for forming the opening 126 may be reduced or minimized. As a result, an opening having a relatively high aspect ratio may be easily realized. In addition, since the data storage layer DS, the lower semiconductor pattern 132, and the channel patterns SP are formed in the opening 126 having the relatively wide area, the degree of difficulty of the processes may be reduced or minimized. Furthermore, since the gate electrodes GE are not formed between the channel patterns SP included in one vertical block VB, the amount of the conductive material used to form the gate electrodes GE may be reduced or minimized. As a result, it may be possible to reduce or prevent problems (e.g., damage of a data storage layer and warpage of a substrate) which may be caused when a gate electrode is formed in a narrow region.

Figure 14A:
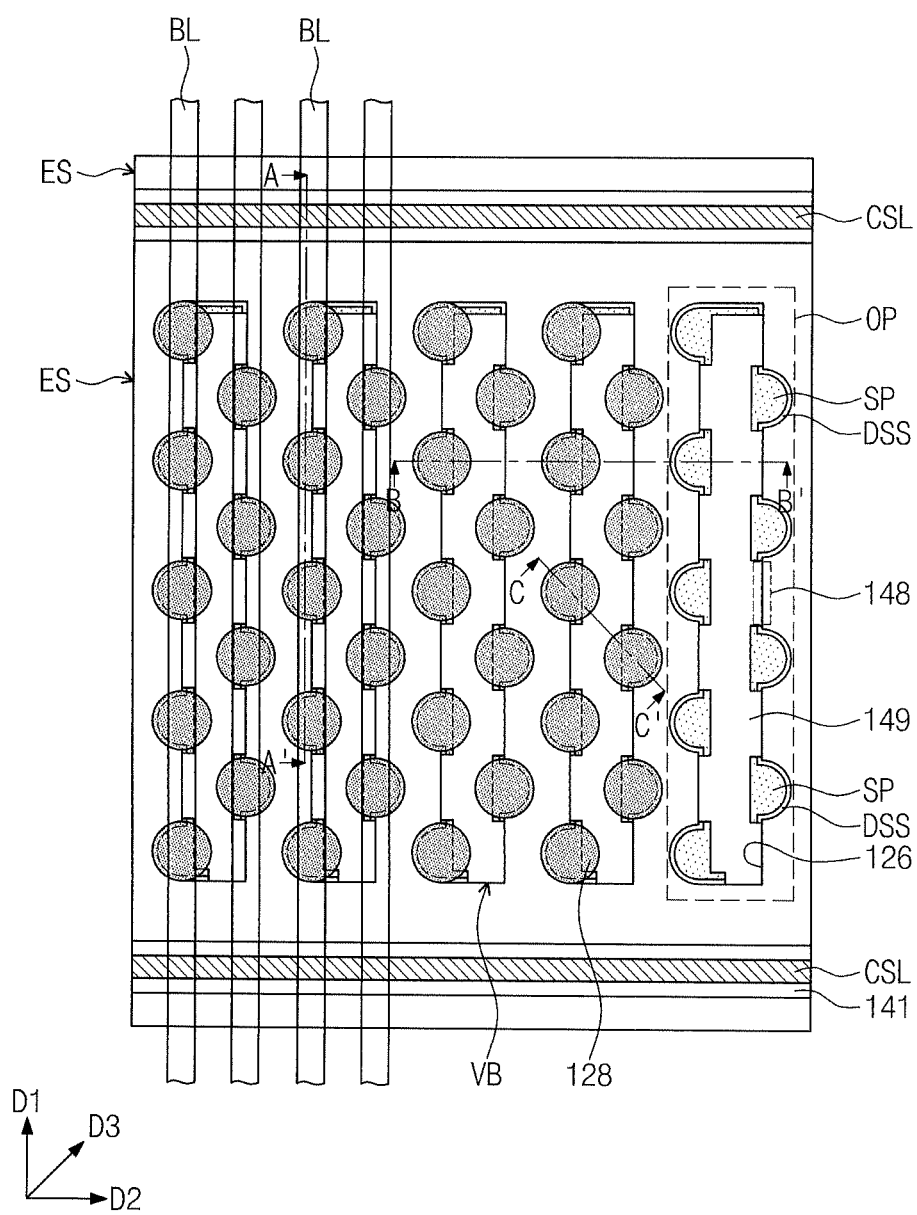
FIG. 14A is a plan view illustrating a semiconductor device according to some embodiments of the inventive concepts.
Figure 14B:
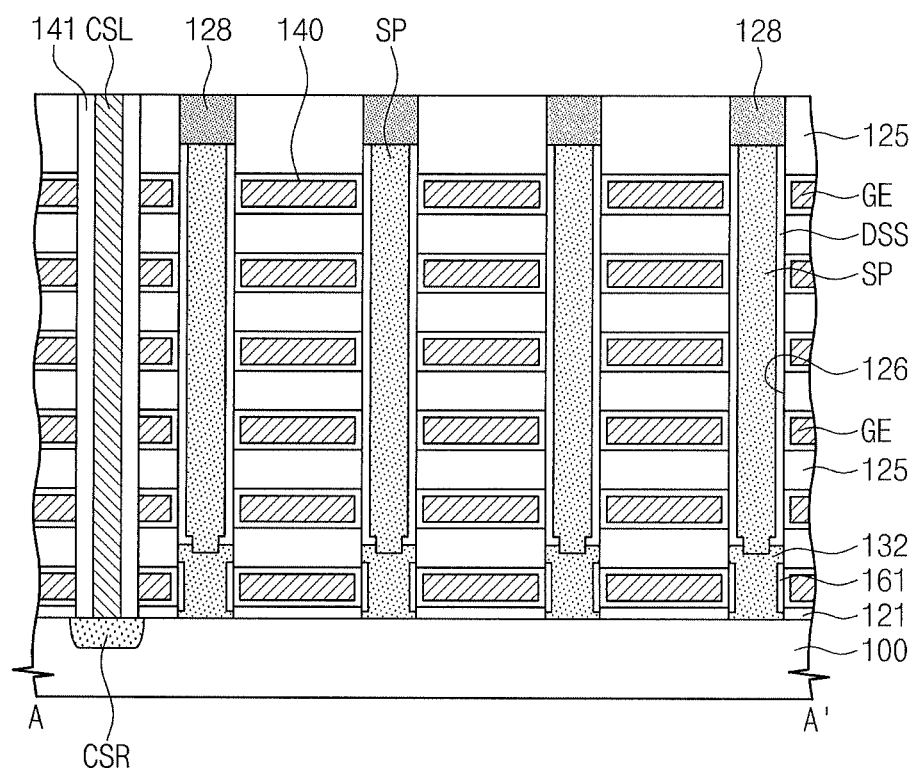
FIG. 14B is a cross-sectional view taken along the line A-A' of FIG. 14A.
Figure 14C:
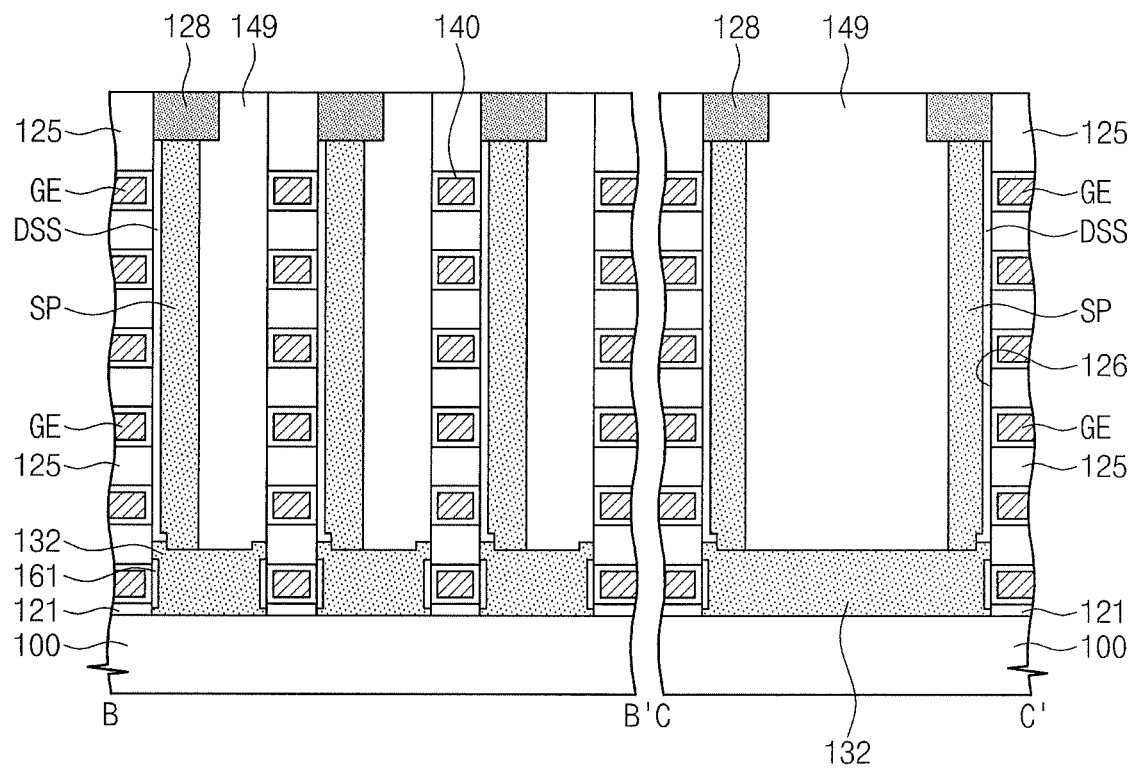
FIG. 14C shows cross-sectional views taken along the lines B-B' and C-C' of FIG. 14A.

FIG. 14A is a plan view illustrating a semiconductor device according to some embodiments of the inventive concepts. FIG. 14B is a cross-sectional view taken along the line A-A' of FIG. 14A. FIG. 14C shows cross-sectional views taken along the lines B-B' and C-C' of FIG. 14A. Hereinafter, the descriptions to the same components as in the above embodiments will be omitted or mentioned briefly for the purpose of ease and convenience in explanation.

Referring to FIGS. 14A, 14B, and 14C, vertical blocks VB may penetrate gate electrodes GE so as to be connected to a substrate 100. The vertical blocks VB may be provided in openings 126 exposing the substrate 100, respectively. In a plan view, each of the openings 126 may include a linear region extending in a first direction D1, and extending regions protruding from both sidewalls of the linear region in a second direction D2 and/or a direction opposite to the second direction D2. In some embodiments, a plurality of the extending regions may be disposed along the sidewall of one linear region.

Each of the vertical blocks VB may include a filling insulation pattern 149 disposed in the linear region and channel patterns SP disposed in the extending regions. Data storage patterns DSS may be provided between the gate electrodes GE and the channel patterns SP. In some embodiments, the filling insulation pattern 149 may have a plate shape that extends in the first direction D1 and is substantially perpendicular to a top surface of the substrate 100. In a plan view, the filling insulation pattern 149 may include protrusions 148, each of which protrudes from the filling insulation pattern 149 and is between the channel patterns SP adjacent to each other. In some embodiments, when the channel patterns SP are arranged in a zigzag form in the first direction D1, the protrusions 148 of the filling insulation pattern 149 may also be arranged in a zigzag form in the first direction D1 and each of the protrusions 148 may be disposed between the channel patterns SP adjacent to each other in the first direction D1.

The data storage patterns DSS may be spaced apart from each other and the protrusions 148 of the filling insulation pattern 149 may be in contact with the horizontal insulating layer 140 between the data storage patterns DSS. When the horizontal insulating layer 140 is omitted, the protrusions 148 may be in contact with the gate electrodes GE. In other words, the data storage patterns DSS may be spaced apart from each other with the protrusions 148 interposed therebetween and may correspond to the channel patterns SP, respectively. For example, the filling insulation pattern 149 may include at least one of silicon oxide, silicon nitride, or silicon oxynitride.

In some embodiments, each of the channel patterns SP may have a semi-cylindrical shape. However, embodiments of the inventive concepts are not limited thereto. In certain embodiments, the channel pattern SP may have a portion PE protruding from a semicircle, as illustrated in FIG. 6F. Each of the vertical blocks VB may further include a lower semiconductor pattern 132 disposed between the substrate 100 and the channel patterns SP. In some embodiments, the lower semiconductor pattern 132 may include a layer grown by an epitaxial process using the substrate 100 as a seed. The lower semiconductor pattern 132 may extend in the first direction D1 corresponding to the extending direction of the filling insulation pattern 149. The lower semiconductor pattern 132 may be connected in common to the channel patterns SP included in each of the vertical blocks VB. In other words, the lower semiconductor pattern 132 may be disposed between the substrate 100 and the filling insulation pattern 149 and may extend between the substrate 100 and the channel patterns SP so as to be in contact with bottom surfaces of the channel patterns SP.

Bit lines BL may be provided on the channel patterns SP, and pads 128 may be provided between the channel patterns SP and the bit lines BL. The pads 128 may extend from top surfaces of the channel patterns SP onto the filling insulation pattern 149. The pads 128 may include at least one of a doped semiconductor material, a metal, a metal silicide, or a metal nitride.

FIGS. 15A to 19A are plan views illustrating a method of manufacturing a semiconductor device according to some embodiments of the inventive concepts. FIGS. 15B to 19B are cross-sectional views taken along the lines A-A' of FIGS.

15A to 19A, respectively. FIGS. 15C to 19C are cross-sectional views taken along the lines B-B' of FIGS. 15A to 19A, respectively.

Figure 15A:
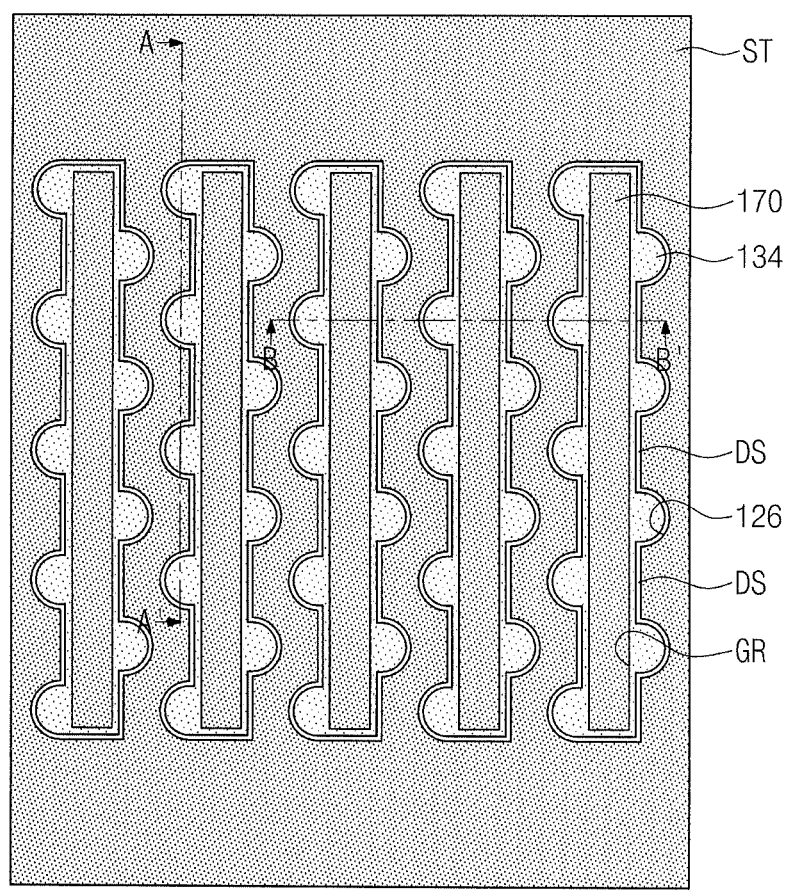
Figure 15A:
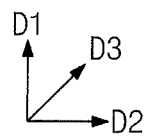
Figure 15B:
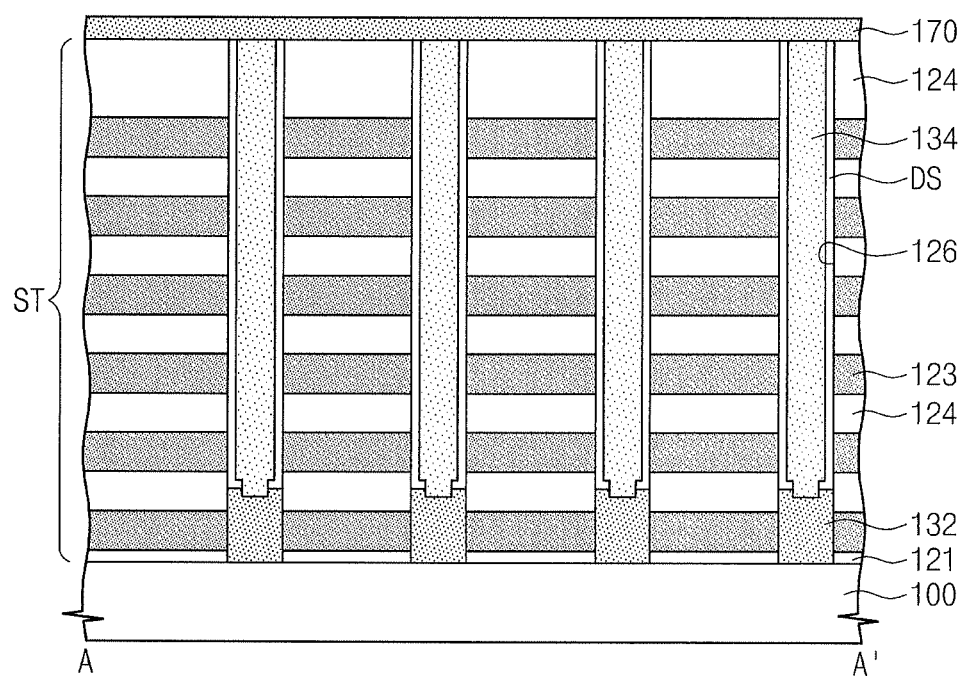
Figure 15C:
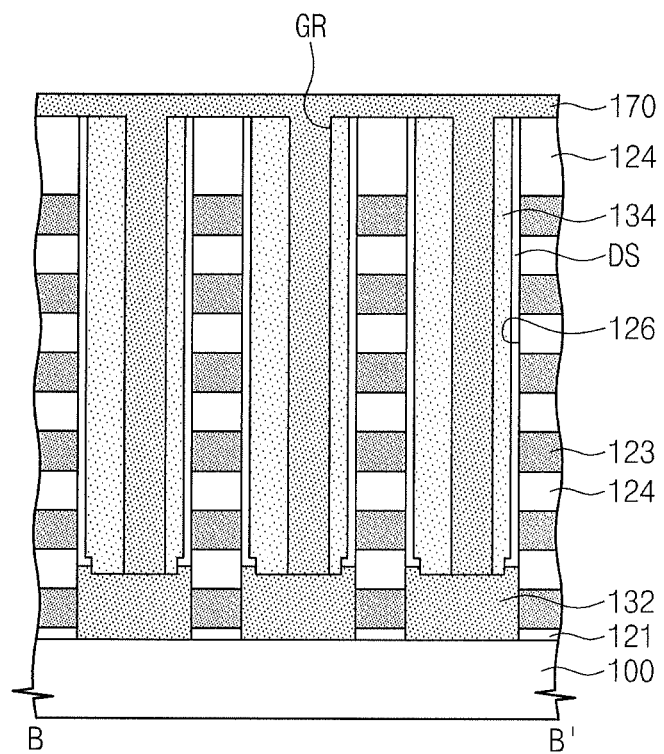

Referring to FIGS. 15A, 15B, and 15C, lower semiconductor patterns 132 may be formed on the structure described with reference to FIGS. 8A to 8C. A data storage layer DS may be formed in the openings 126. The data storage layer DS may be substantially conformally formed along a sidewall and a bottom surface of each of the openings 126. The data storage layer DS may include a blocking insulating layer, a charge storage layer, and a tunnel insulating layer which are sequentially formed on the sidewall of each of the openings 126.

Semiconductor patterns 134 may be formed to penetrate the data storage layer DS. The semiconductor patterns 134 may be connected to the lower semiconductor pattern 132. In some embodiments, a spacer layer may be formed on the data storage layer DS, and an anisotropic etching process may be performed on the spacer layer to form an outer pattern (e.g., 137 of FIG. 7A) on the sidewall of each of the openings 126. The outer pattern may have a spacer shape. An inner pattern may be formed on the outer pattern. The inner pattern may include the same material as the outer pattern. The process of forming the inner pattern may include an anisotropic etching process. A bottom portion of the inner pattern may be removed by the anisotropic etching process to expose the lower semiconductor pattern 132. As a result, the semiconductor patterns 134 may be confinedly formed in the openings 126, respectively, and gap regions GR exposing the lower semiconductor patterns 132 may be defined in the openings 126, respectively.

The gap regions GR may extend along the openings 126 in the first direction D1. A first mask layer 170 may be formed to fill the gap regions GR. The first mask layer 170 may include a material of which an etch rate is higher than those of the data storage layer DS and the semiconductor patterns 134 in an etching process using a specific etchant. For example, when the semiconductor patterns 134 include a semiconductor material (e.g., silicon) and the data storage layer DS includes an insulating material (e.g., an oxide and/or a nitride), the first mask layer 170 may include, but not limited to, a spin-on-hardmask (SOH) material. In some embodiments, a carbon content of the first mask layer 170 may range from about 70 wt % to about 95 wt %. The first mask layer 170 may be formed by a spin-coating process and a bake process. Lower portions of the first mask layer 170 may be in contact with the lower semiconductor patterns 132.

Figure 16A:
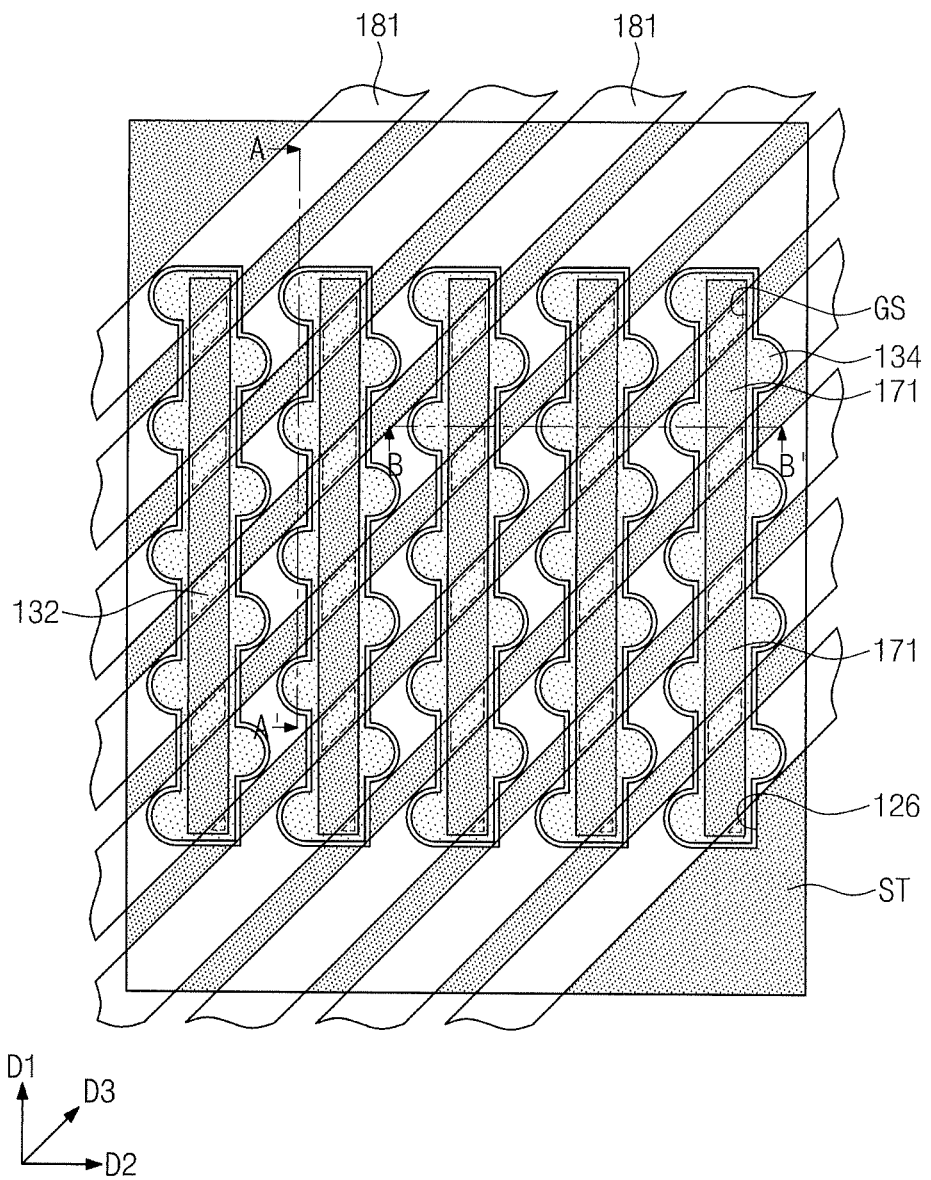
Figure 16B:
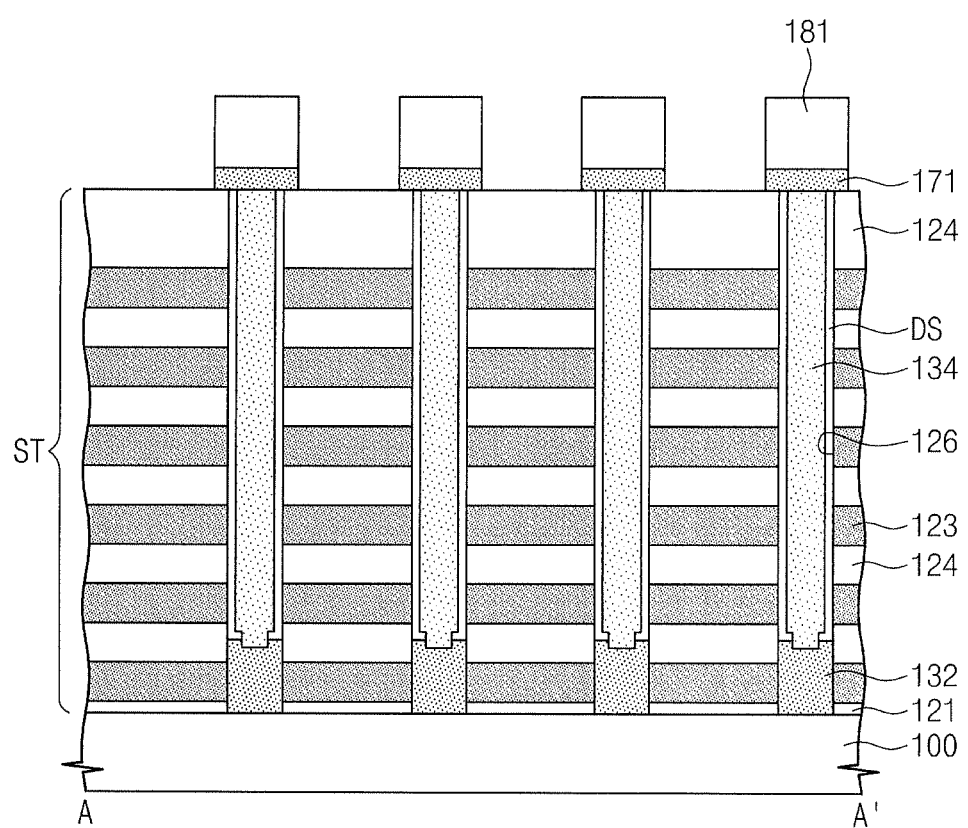
Figure 16C:
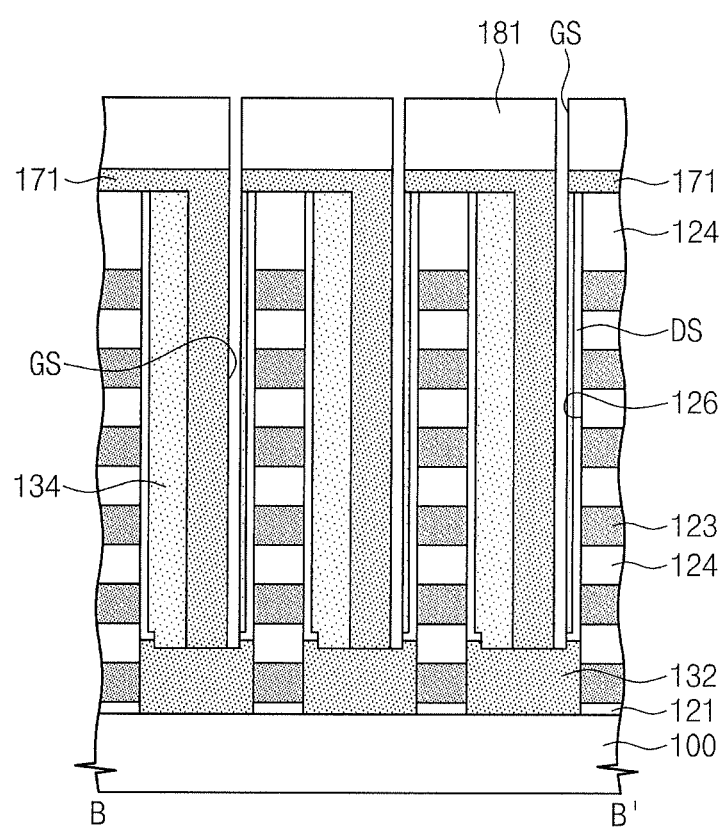

Referring to FIGS. 16A, 16B, and 16C, second mask patterns 181 may be formed on the first mask layer 170. Each of the second mask patterns 181 may extend in a third direction D3 intersecting the first and second directions D1 and D2. In some embodiments, each of the second mask patterns 181 may overlap with the extending regions ER of FIG. 8A of the openings 126, which are arranged in the third direction D3. For example, the second mask patterns 181 may include at least one of photoresist, silicon oxide, silicon nitride, or silicon oxynitride.

Exposed portions of the first mask layer 170 may be removed using the second mask patterns 181 as an etch mask. As a result, the first mask layer 170 may be formed into first mask patterns 171. Portions of the first mask patterns 171, which are disposed in each of the gap regions GR, may be separated from each other in the first direction D1. In other words, in each of the gap regions GR, the first mask patterns 171 may be spaced apart from each other with gap portions GS interposed therebetween. The gap portions GS may expose the lower semiconductor pattern 132. The gap portions GS may correspond to portions of the gap region GR. In a plan view, each of the gap portions GS may have, but not limited to, a parallelogram shape. Each of the gap portions GS may be defined by sidewalls of the first mask patterns 171, sidewalls of the semiconductor patterns 134, and a top surface of the lower semiconductor pattern 132.

Figure 17A:
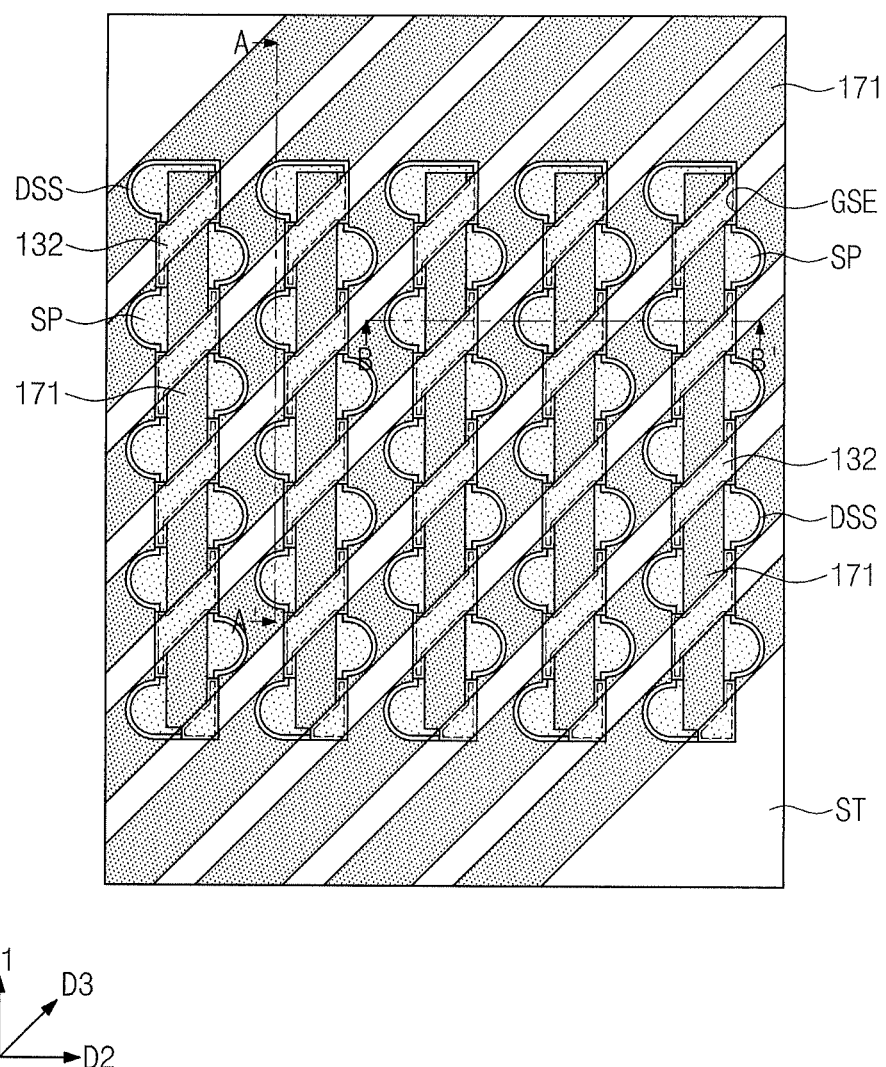
Figure 17B:
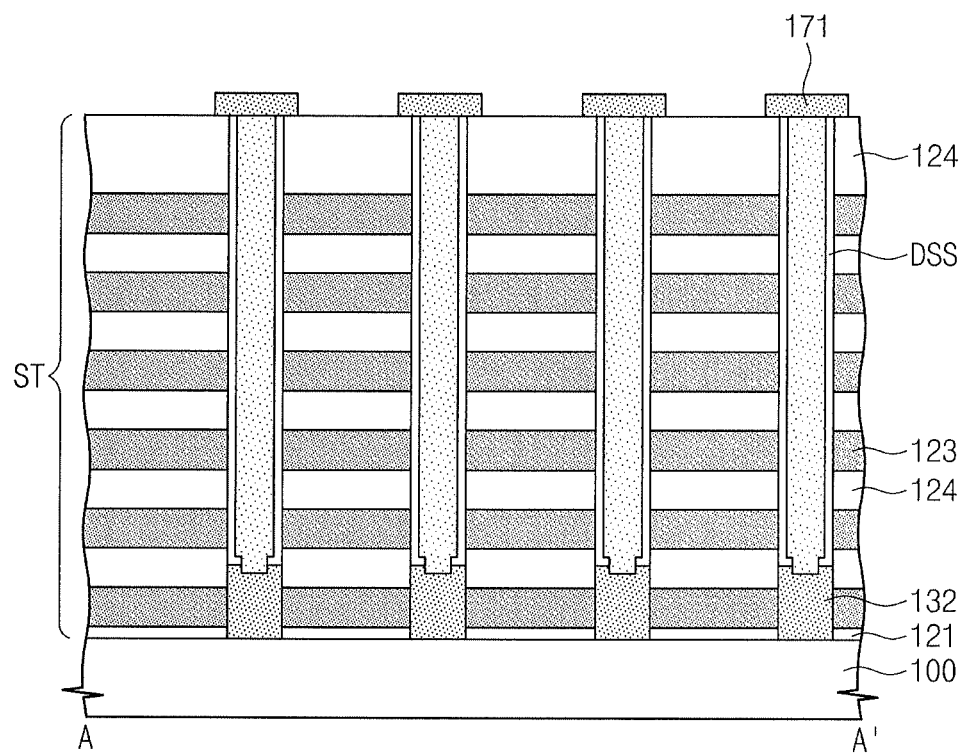
Figure 17C:
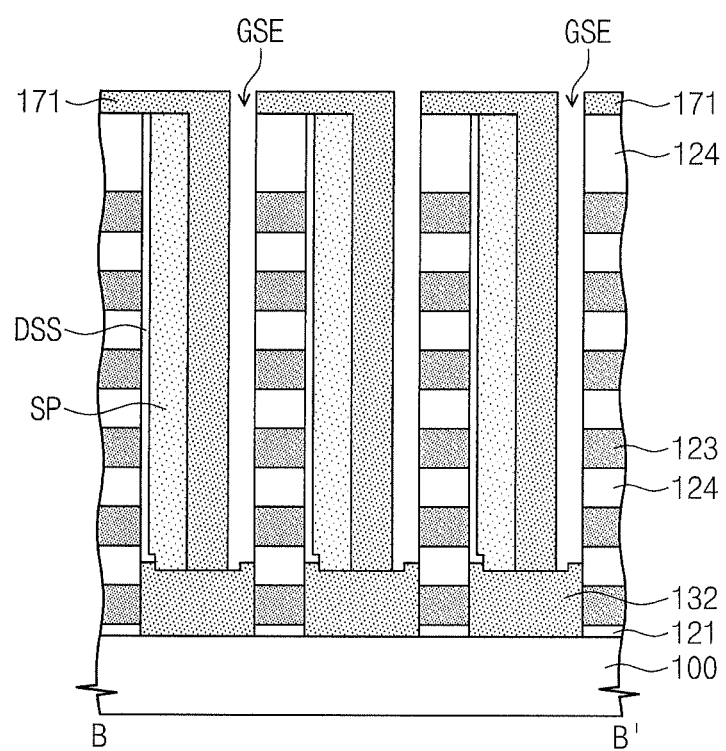

Referring to FIGS. 17A, 17B, and 17C, the second mask patterns 181 may be removed, and then, the exposed sidewall of the semiconductor pattern 134 and the a sidewall of the data storage layer DS may be sequentially etched using the first mask patterns 171 as an etch mask. As a result, the semiconductor patterns 134 may be divided into channel patterns SP separated from each other, and the data storage layer DS may be divided into data storage patterns DSS separated from each other. The gap portions GS may be formed into extended gap portions GSE. The extended gap portions GSE may correspond to the gap portions GS laterally enlarged. Both end portions of each of the extended gap portions GSE may include portions protruding in the first direction D1, as illustrated in FIG. 17A. However, embodiments of the inventive concepts are not limited thereto. The extended gap portions GSE may expose the sacrificial layers 123 and the insulating layers 124.

The channel patterns SP may have the shapes illustrated in FIG. 6F. However, embodiments of the inventive concepts are not limited thereto. In certain embodiments, the shapes of the channel patterns SP may be variously modified. The data storage patterns DSS may be spaced apart from each other.

Figure 18A:
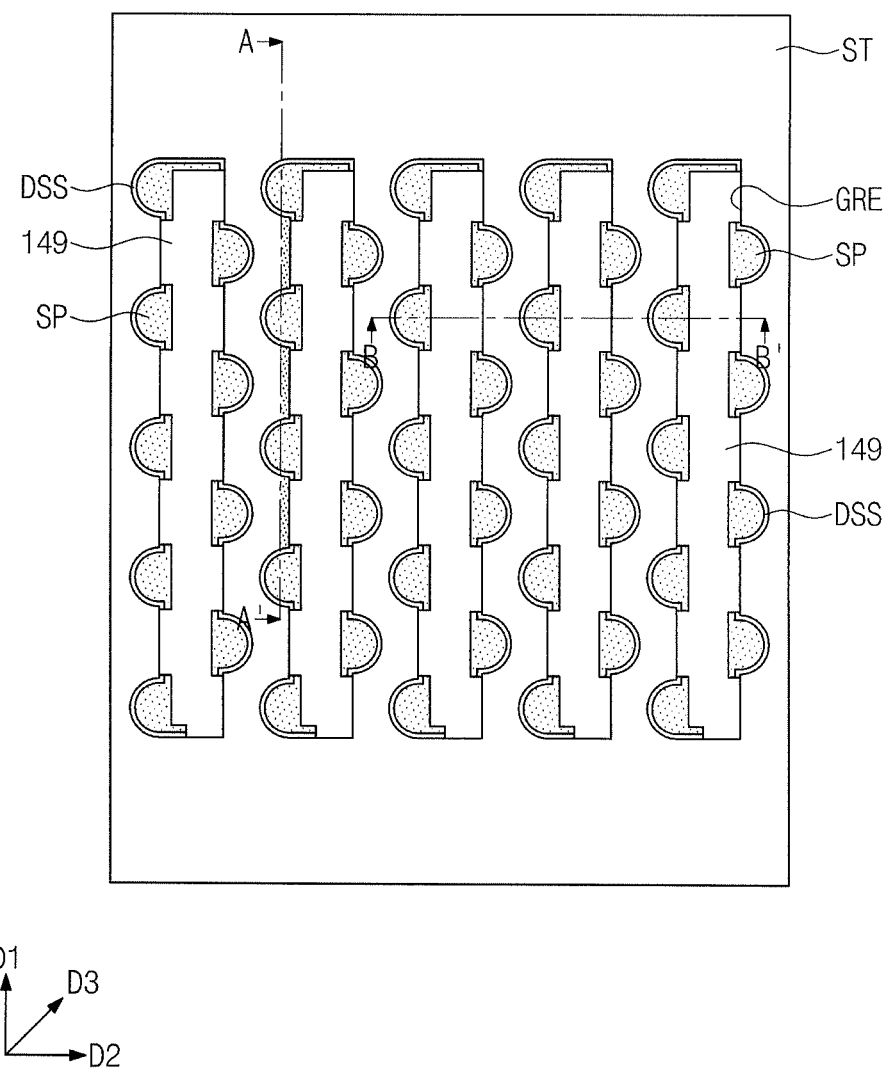
Figure 18B:
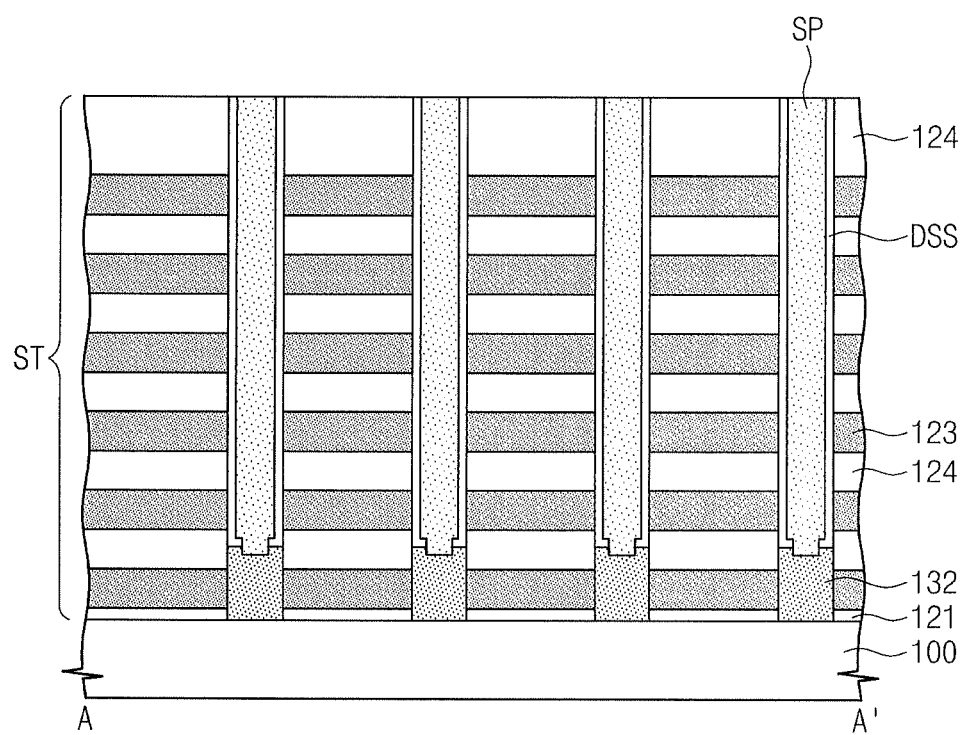
Figure 18C:
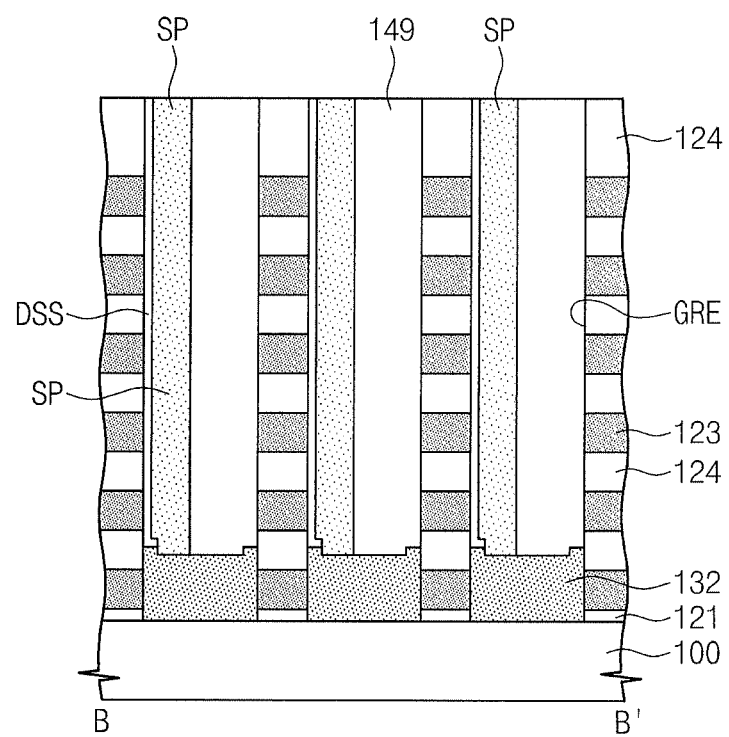

Referring to FIGS. 18A, 18B, and 18C, the first mask patterns 171 may be selectively removed to form extended gap regions GRE. Filling insulation patterns 149 may be formed to fill the extended gap regions GRE, respectively. For example, the filling insulation patterns 149 may include silicon oxide. The process of forming the filling insulation patterns 149 may include a planarization process. The filling insulation patterns 149 may be in contact with the insulating layers 124 and the sacrificial layers 123.

Figure 19A:
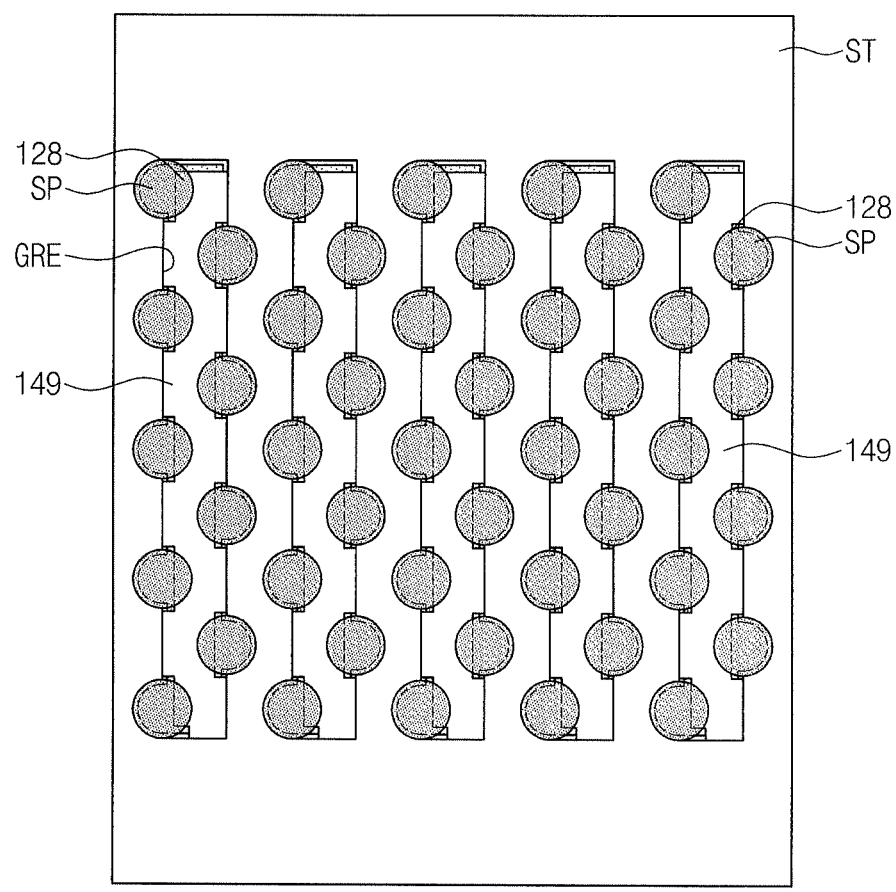
Figure 19B:
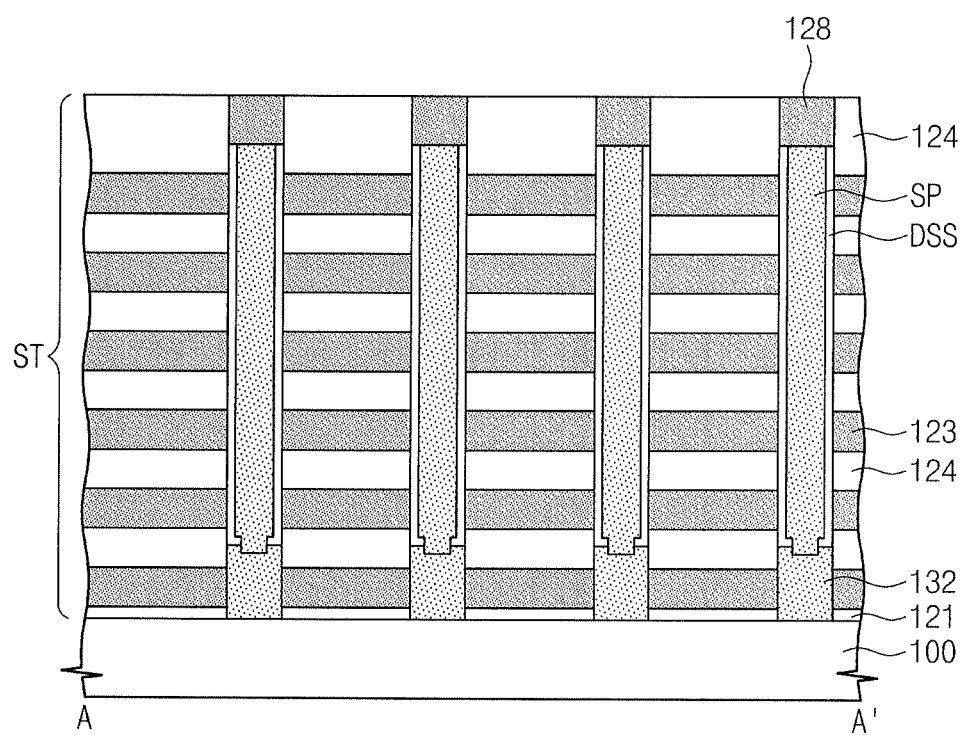
Figure 19C:
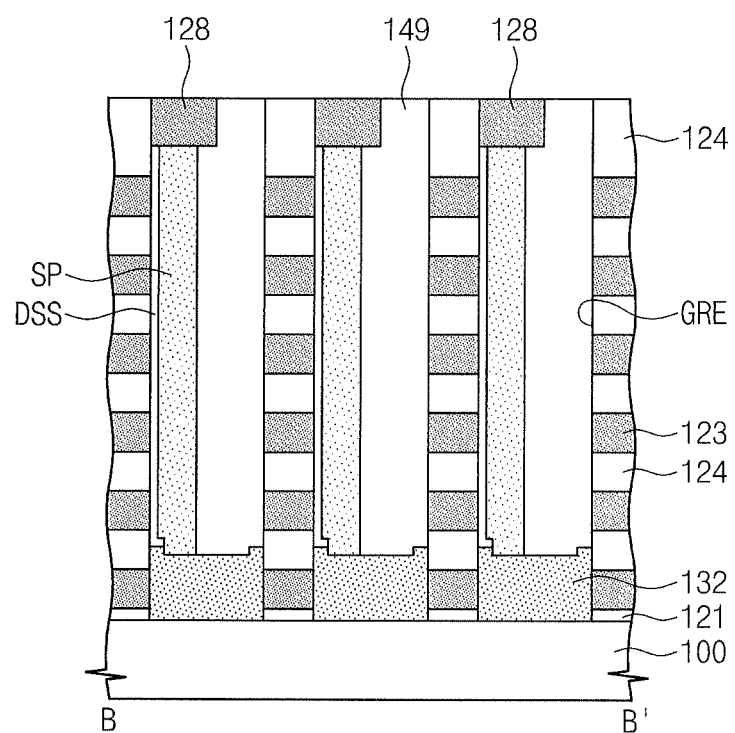

Referring to FIGS. 19A, 19B, and 19C, upper portions of the channel patterns SP and portions of upper portions of the filling insulation patterns 149 may be recessed, and pads 128 may be formed in the recessed regions, respectively. The pads 128 may include at least one of doped poly-silicon or a metal. Dopant ions of a second conductivity type may be implanted into the pads 128 and top end portions of the channel patterns SP to form drain regions (not shown). The second conductivity type may be, for example, an N-type.

Thereafter, the processes described with reference to FIGS. 13A to 13C and 5A to 5C may be performed to manufacture the semiconductor device illustrated in FIGS. 14A to 14C.

FIGS. 20A to 20D are plan views illustrating semiconductor devices according to some embodiments of the inventive concepts. Hereinafter, the descriptions to the same components as in the above embodiments will be omitted or mentioned briefly for the purpose of ease and convenience in explanation.

Figure 20A:
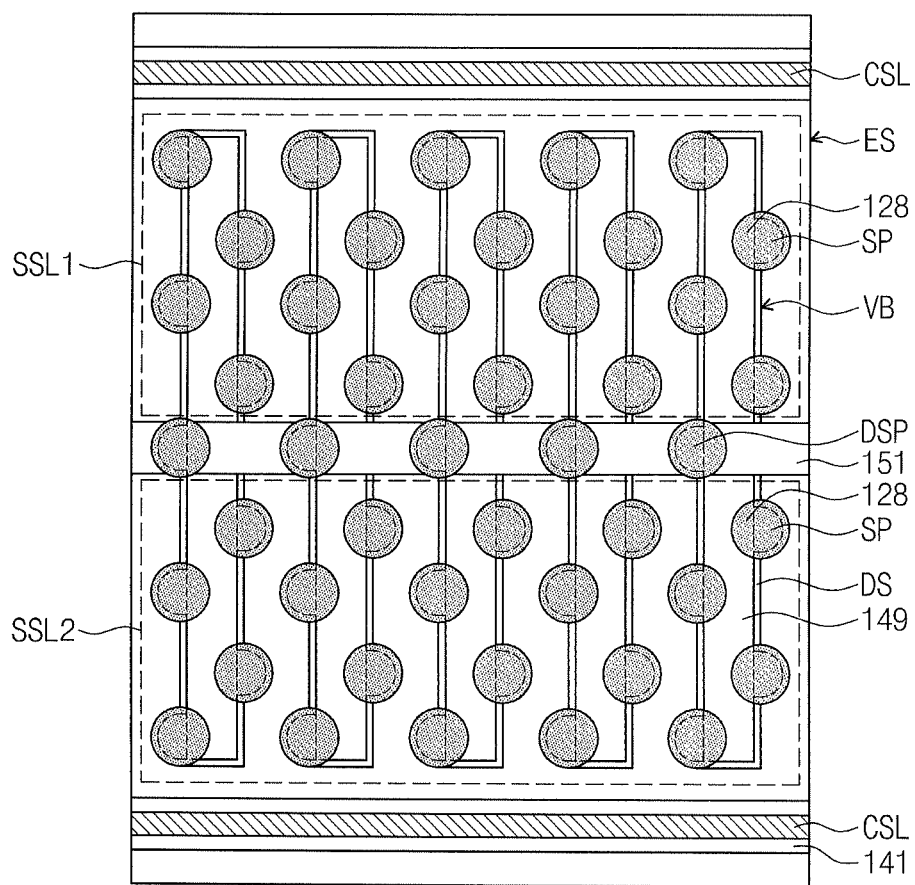
FIGS. 20A to 20D are plan views illustrating semiconductor devices according to some embodiments of the inventive concepts.

Referring to FIG. 20A, an electrode structure ES may include a first string selection line SSL1 and a second string selection line SSL2 which are separated from each other by a separation insulating layer 151. For example, the separation insulating layer 151 may include at least one of silicon oxide, silicon nitride, or silicon oxynitride. The separation insulating layer 151 may laterally separate the string selection lines disposed in an upper portion of the electrode structure ES. A bottom surface of the separation insulating layer 151 may be higher than the uppermost one of the word lines disposed under the first and second string selection lines SSL1 and SSL2. The separation insulating layer 151 may extend in the second direction D2 and may be disposed between dummy channel patterns DSP. The dummy channel patterns DSP may be formed together with the channel patterns SP and may have the substantially same structure as the channel patterns SP. The dummy channel patterns DSP may not be connected to the bit lines and may not constitute memory cells. Pads 128 may be provided on the dummy channel patterns DSP, as illustrated in FIG. 20A. Alternatively, pads 128 may not be provided on the dummy channel patterns DSP. A data storage layer DS may be laterally divided by the separation insulating layer 151.

Figure 20B:
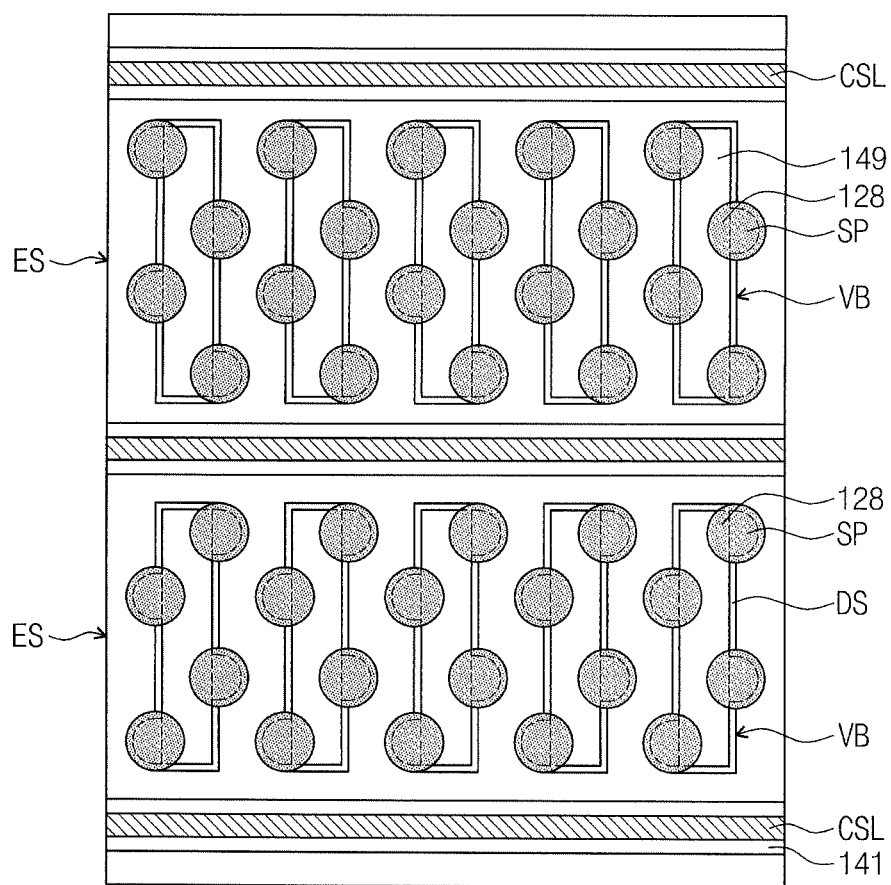
Figure 20C:
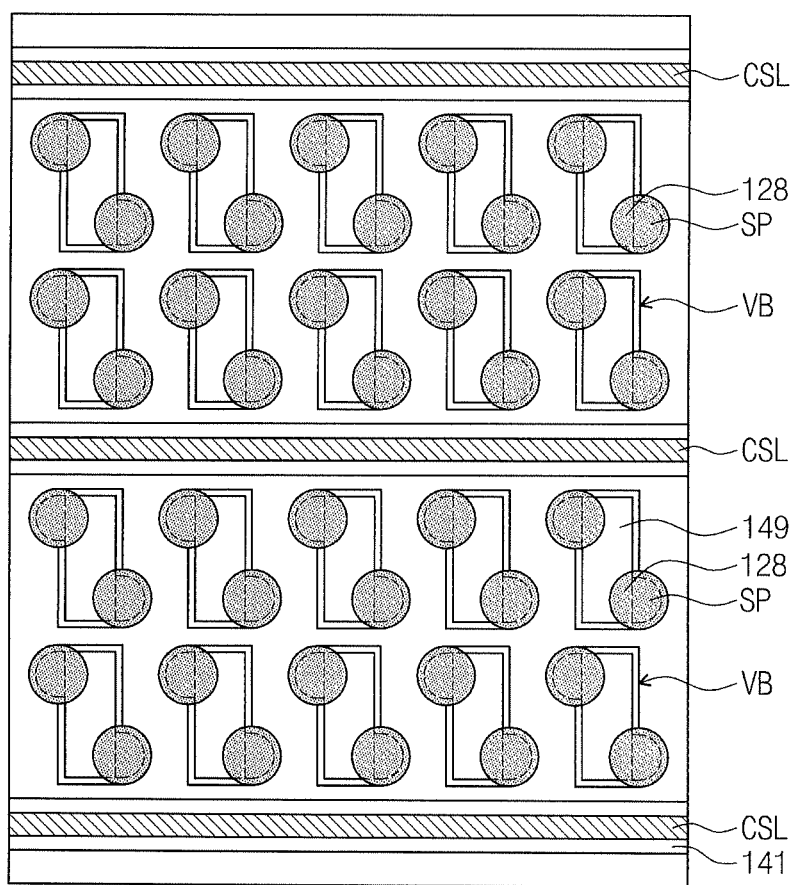

In the embodiments described with reference to FIGS. 5A and 14A, each of the vertical blocks VB may include nine channel patterns SP. However, embodiments of the inventive concepts are not limited thereto. In certain embodiments, the number of the channel patterns SP included in each of the vertical blocks VB may be variously changed. In some embodiments, one vertical block VB may include four channel patterns SP as illustrated in FIG. 20B, or one vertical block VB may include two channel patterns SP as illustrated in FIG. 20C.

Figure 20D:
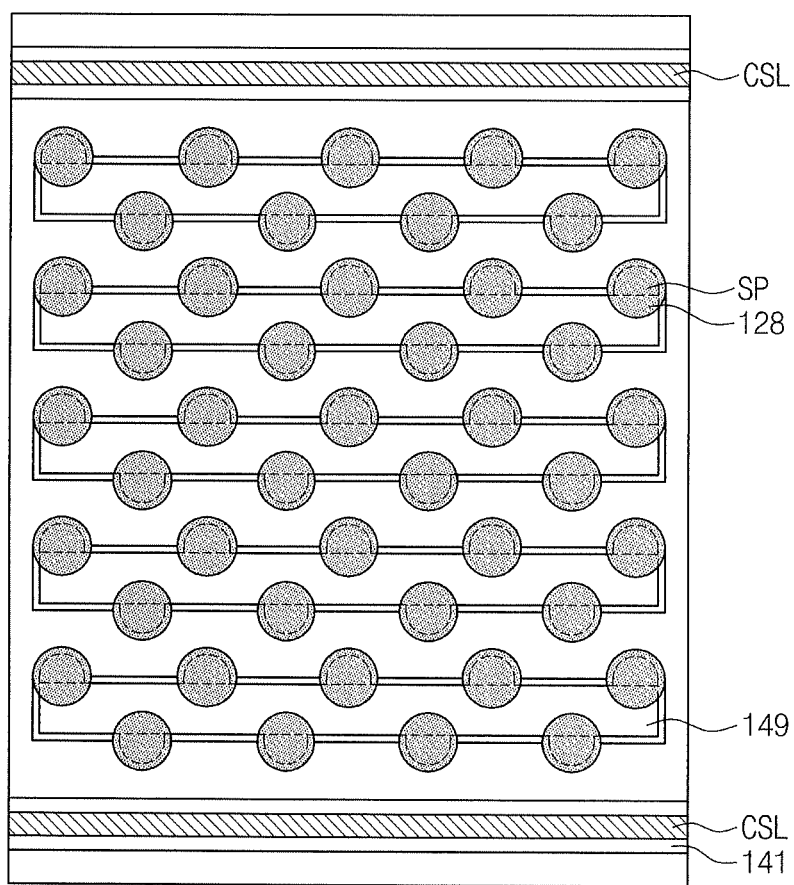

In the embodiments described with reference to FIGS. 5A and 14A, the vertical blocks VB may extend in the first direction D1. However, embodiments of the inventive concepts are not limited thereto. In certain embodiments, each of the vertical blocks VB may extend in the second direction D2, as illustrated in FIG. 20D. The first direction D1 may be the direction in which the gate electrodes (e.g., the word lines) extend. The second direction D2 may be the direction in which the bit lines extend. Alternatively, the vertical blocks VB may extend in a direction intersecting all of the first and second directions D1 and D2.

According to some embodiments of the inventive concepts, an opening in which a channel pattern is formed may have a relative wide area. Thus, the degree of difficulty of an etching process for forming the opening may be reduced or minimized. As a result, the opening having a relatively high aspect ratio may be easily formed. In addition, since a data storage layer, a lower semiconductor pattern, and a channel patterns are formed in the opening having the relatively wide area, the degree of difficulty of the manufacturing processes may be reduced or minimized. Furthermore, since the gate electrodes are not formed between the channel patterns included in one vertical block, the amount of conductive material used to form the gate electrodes may be reduced or minimized. As a result, it may be possible to reduce or prevent problems (e.g., damage of a data storage layer and warpage of a substrate) which may be caused when a gate electrode is formed in a narrow region.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A vertical NAND non-volatile memory structure comprising:
   a substrate extending horizontally;
   a gate electrode extending horizontally;
   a vertical block provided in an opening of the vertical NAND non-volatile memory structure, the vertical block penetrating the gate electrode and including a filling insulating pattern and a channel pattern, wherein the opening includes a linear region extending in a first horizontal direction D1 and extending regions extending in a second horizontal direction D2, and the second horizontal direction D2 is perpendicular to the first horizontal direction D1; and
   wherein the channel pattern extends vertically from the substrate, and
   wherein the channel pattern is disposed in the extending regions opening and has a non-circular shape extending in the second horizontal direction D2 in a plan view of the channel pattern.

2. The vertical NAND non-volatile memory structure of claim 1 wherein the channel pattern includes a curved side wall as part of the non-circular shape.

3. The vertical NAND non-volatile memory structure of claim 2 wherein the channel pattern further includes a linear side wall opposite the curved side wall.

4. The vertical NAND non-volatile memory structure of claim 3, wherein the curved side wall extends in an arc exceeding 180 degrees in the plan view.

5. The vertical NAND non-volatile memory structure of claim 3, wherein the curved side wall extends in an arc less than 180 degrees in the plan view.

6. The vertical NAND non-volatile memory structure of claim 3 wherein the channel pattern has a semi-circular shape in the plan view.

7. The vertical NAND non-volatile memory structure of claim 2 wherein the curved side wall comprises a first curved side wall, the channel pattern further includes a second curved side wall opposite the first curved side wall.

8. The vertical NAND non-volatile memory structure of claim 7 wherein the first and second curved side walls are curved differently in the same direction.

9. The vertical NAND non-volatile memory structure of claim 7 wherein the first and second curved side walls are curved differently in opposite directions.

10. The vertical NAND non-volatile memory structure of claim 5 further comprising:
    an additional linear portion of the channel pattern spacing the curved side wall apart from the linear side wall.

11. The vertical NAND non-volatile memory structure of claim 2 wherein the channel pattern has a semi-annular shape including a curved inner side wall opposite the curved side wall.

12. The vertical NAND non-volatile memory structure of claim 1, wherein the vertical NAND non-volatile memory structure is characterized by layers of approximately uniform thickness.

13. A vertical NAND non-volatile memory structure comprising:
    a substrate extending horizontally;
    gate electrodes extending horizontally on the substrate;
    a vertical block penetrating the gate electrodes and including a filling insulating pattern and channel patterns having non-circular shapes,
    wherein the filling insulating pattern extends in a first horizontal direction,
    wherein the channel patterns contact side surfaces of the filling insulating pattern and protrude from the side surfaces of the filling insulating pattern in a second horizontal direction perpendicular to the first horizontal direction.

14. The vertical NAND non-volatile memory structure of claim 13 further comprises a data storage layer between the gate electrodes and the channel patterns,
   wherein the data storage layer covers a first side surface of each of the channel patterns,
   wherein the filling insulating pattern covers a second side surface of each of the channel patterns.

15. The vertical NAND non-volatile memory structure of claim 14 wherein the second side surface of each of the channel patterns contacts the filling insulating pattern.

16. The vertical NAND non-volatile memory structure of claim 13 wherein the channel patterns include a first channel pattern and a second channel pattern spaced apart from the first channel pattern with the filling insulating pattern therebetween,
   the gate electrodes do not extend between the first channel pattern and the second channel pattern.

17. The vertical NAND non-volatile memory structure of claim 16 wherein the vertical block further comprises a lower semiconductor pattern between the substrate and the filling insulating pattern,
   wherein the first and the second channel patterns are connected in common to the lower semiconductor pattern.

18. The vertical NAND non-volatile memory structure of claim 17 wherein the lower semiconductor pattern contacts a bottom surface of the filling insulating pattern and the bottom surfaces of the first and a second channel pattern.

* * * * *